United States Patent
Lin et al.

(10) Patent No.: US 10,522,234 B2
(45) Date of Patent: Dec. 31, 2019

(54) BIT TAGGING METHOD, MEMORY CONTROL CIRCUIT UNIT AND MEMORY STORAGE DEVICE

(71) Applicant: PHISON ELECTRONICS CORP., Miaoli (TW)

(72) Inventors: Wei Lin, Taipei (TW); Yu-Hsiang Lin, Yunlin County (TW); Yu-Cheng Hsu, Yilan County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 66 days.

(21) Appl. No.: 15/890,326

(22) Filed: Feb. 6, 2018

(65) Prior Publication Data
US 2019/0189228 A1    Jun. 20, 2019

(30) Foreign Application Priority Data
Dec. 15, 2017    (TW) .............................. 106144129 A

(51) Int. Cl.
| | | |
|---|---|---|
| *G11C 29/00* | (2006.01) | |
| *G11C 16/34* | (2006.01) | |
| *G06F 11/10* | (2006.01) | |
| *G11C 16/10* | (2006.01) | |
| *G11C 29/52* | (2006.01) | |
| *G11C 16/26* | (2006.01) | |

(52) U.S. Cl.
CPC ...... *G11C 16/3459* (2013.01); *G06F 11/1068* (2013.01); *G11C 16/10* (2013.01); *G11C 29/52* (2013.01); *G11C 16/26* (2013.01)

(58) Field of Classification Search
CPC .. G06F 11/1072; G06F 11/1076; G06F 11/08; G06F 11/1068; G06F 11/1048; H03M 13/1108; H03M 13/3707; H03M 13/1111; H03M 13/1102; G11C 11/5642; G11C 2029/0411
See application file for complete search history.

(56) References Cited

U.S. PATENT DOCUMENTS

| | | | |
|---|---|---|---|
| 9,214,965 B2 | 12/2015 | Fitzpatrick et al. | |
| 2015/0169401 A1* | 6/2015 | Tseng .................. | G06F 11/1068 714/773 |
| 2015/0186212 A1* | 7/2015 | Lin ...................... | G06F 11/1072 714/764 |

OTHER PUBLICATIONS

"Office Action of Taiwan Counterpart Application", dated Jul. 3, 2018, p. 1-p. 11.

* cited by examiner

*Primary Examiner* — Guerrier Merant
(74) *Attorney, Agent, or Firm* — JCIPRNET

(57) ABSTRACT

A bit tagging method, a memory control circuit unit and a memory storage device are provided. The method includes: reading first memory cells according to a first reading voltage to generate a first codeword and determining whether the first codeword is a valid codeword, and the first codeword includes X bits; if not, reading the first memory cells according to a second reading voltage to generate a second codeword and determining whether the second codeword is the valid codeword, and the second codeword includes X bits; and if the second codeword is not the valid codeword and a $Y^{th}$ bit in the X bits of the first codeword is different from a $Y^{th}$ bit in the X bits of the second codeword, recording the $Y^{th}$ bit in the X bits as an unreliable bit, and Y is a positive integer less than or equal to X.

21 Claims, 14 Drawing Sheets

BIT TAGGING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 106144129, filed on Dec. 15, 2017. The entirety of the above-mentioned patent application is hereby incorporated by reference herein and made a part of this specification.

BACKGROUND OF THE INVENTION

Field of the Invention

The invention relates to a bit tagging method, a memory control circuit unit and a memory storage device.

Description of Related Art

Digital cameras, mobile phones and MP3 players have grown rapidly in recent years, and consumer's demand for storage media is also rapidly increased. Since a rewritable non-volatile memory module (for example, a flash memory) has features of non-volatile, power-saving, small volume and non-mechanical structure, etc., it is very suitable for being built-in the aforementioned various portable multimedia devices.

Generally, when data is read from the rewritable non-volatile memory module, a memory management circuit may first execute a hard bit mode decoding operation to perform decoding to obtain the data to be read. However, when the hard bit mode decoding operation is executed and the decoding is failed, the memory management circuit may execute a soft bit mode decoding operation to obtain the data to be read. As the hard bit mode decoding operation and the soft bit mode decoding operation are independent to each in operation, if the hard bit mode decoding operation and the soft bit mode decoding operation are consecutively executed, since the soft bit mode decoding operation does not refer to related information obtained in execution of the hard bit mode decoding operation, accessing efficiency of the rewritable non-volatile memory module is probably low.

SUMMARY OF THE INVENTION

The invention is directed to bit tagging method, a memory control circuit unit and a memory storage device, which are adapted to learn a position of a bit with lower reliability in a codeword in a hard bit mode decoding operation, and obtain related information (for example, a decoding initial value) used for a soft bit mode decoding operation, and then apply the related information to the soft bit mode decoding operation, so as to improve accessing efficiency of a rewritable non-volatile memory module.

The invention provides a bit tagging method, which is adapted to a rewritable non-volatile memory module, wherein the rewritable non-volatile memory module includes a plurality of memory cells, and the bit tagging method includes: reading a plurality of first memory cells in the memory cells according to a first reading voltage of a plurality of reading voltages and executing a first decoding operation to generate a first codeword and first verification information, and determining whether the first codeword is a valid codeword according to the first verification information, wherein the first codeword includes X bits and X is a positive integer; if the first codeword is not the valid codeword, reading the first memory cells according to a second reading voltage of the plurality of reading voltages and executing the first decoding operation to generate a second codeword and second verification information, and determining whether the second codeword is the valid codeword according to the second verification information, wherein the second codeword includes X bits; and if the second codeword is not the valid codeword and a $Y^{th}$ bit in the X bits of the first codeword is different from a $Y^{th}$ bit in the X bits of the second codeword, recording the $Y^{th}$ bit in the X bits as a first unreliable bit, wherein Y is a positive integer less than or equal to X.

The invention provides a memory control circuit unit, which is adapted to a rewritable non-volatile memory module, wherein the rewritable non-volatile memory module includes a plurality of memory cells, and the memory control circuit unit includes a host interface, an error checking and correcting circuit, a memory interface and a memory management circuit. The host interface is coupled to a host system. The memory interface is coupled to the rewritable non-volatile memory module. The memory management circuit is coupled to the host interface, the error checking and correcting circuit and the memory interface. The memory management circuit executes following operations: sends a first reading command sequence according to a first reading voltage of a plurality of reading voltages to read a plurality of first memory cells in the memory cells, and executes a first decoding operation through the error checking and correcting circuit to generate a first codeword and first verification information, and determines whether the first codeword is a valid codeword according to the first verification information, wherein the first codeword includes X bits and X is a positive integer; if the first codeword is not the valid codeword, sends a second reading command sequence according to a second reading voltage of the plurality of reading voltages to read the first memory cells, and executes the first decoding operation through the error checking and correcting circuit to generate a second codeword and second verification information, and determines whether the second codeword is the valid codeword according to the second verification information, wherein the second codeword includes X bits; and if the second codeword is not the valid codeword and a $Y^{th}$ bit in the X bits of the first codeword is different from a $Y^{th}$ bit in the X bits of the second codeword, records the $Y^{th}$ bit in the X bits as a first unreliable bit, wherein Y is a positive integer less than or equal to X.

The invention provides a memory storage device, the memory storage device includes a connection interface unit, a rewritable non-volatile memory module and a memory control circuit unit. The connection interface unit is coupled to a host system. The rewritable non-volatile memory module includes a plurality of memory cells. The memory control circuit unit is coupled to the connection interface unit and the rewritable non-volatile memory module. The memory control circuit unit executes following operations: sends a first reading command sequence according to a first reading voltage of a plurality of reading voltages to read a plurality of first memory cells in the memory cells, and executes a first decoding operation to generate a first codeword and first verification information, and determines whether the first codeword is a valid codeword according to the first verification information, wherein the first codeword includes X bits and X is a positive integer; if the first codeword is not the valid codeword, sends a second reading command sequence according to a second reading voltage of the plurality of reading voltages to read the first memory cells, and executes the first decoding operation to generate a second codeword and second verification information, and determines whether the second codeword is the valid codeword according to the second verification information, wherein the second codeword includes X bits; and if the second codeword is not the valid codeword and a $Y^{th}$ bit in the X bits of the first codeword is different from a $Y^{th}$ bit in the X bits of the second codeword, records the $Y^{th}$ bit in the X bits as a first unreliable bit, wherein Y is a positive integer less than or equal to X.

According to the above description, the bit tagging method, the memory control circuit unit and the memory storage device of the invention may learn a bit with lower reliability in a codeword in a hard bit mode decoding operation, and obtain related information (for example, a decoding initial value) for a soft bit mode decoding operation, and then apply the related information to the soft bit mode decoding operation, so as to improve accessing efficiency of the rewritable non-volatile memory module.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Generally, a memory storage device (which is also referred to as a memory storage system) includes a rewritable non-volatile memory module and a controller (which is also referred to as a control circuit). The memory storage device is generally used together with a host system, such that the host system is adapted to write data into the memory storage device or read data from the memory storage device.

Figure 1:
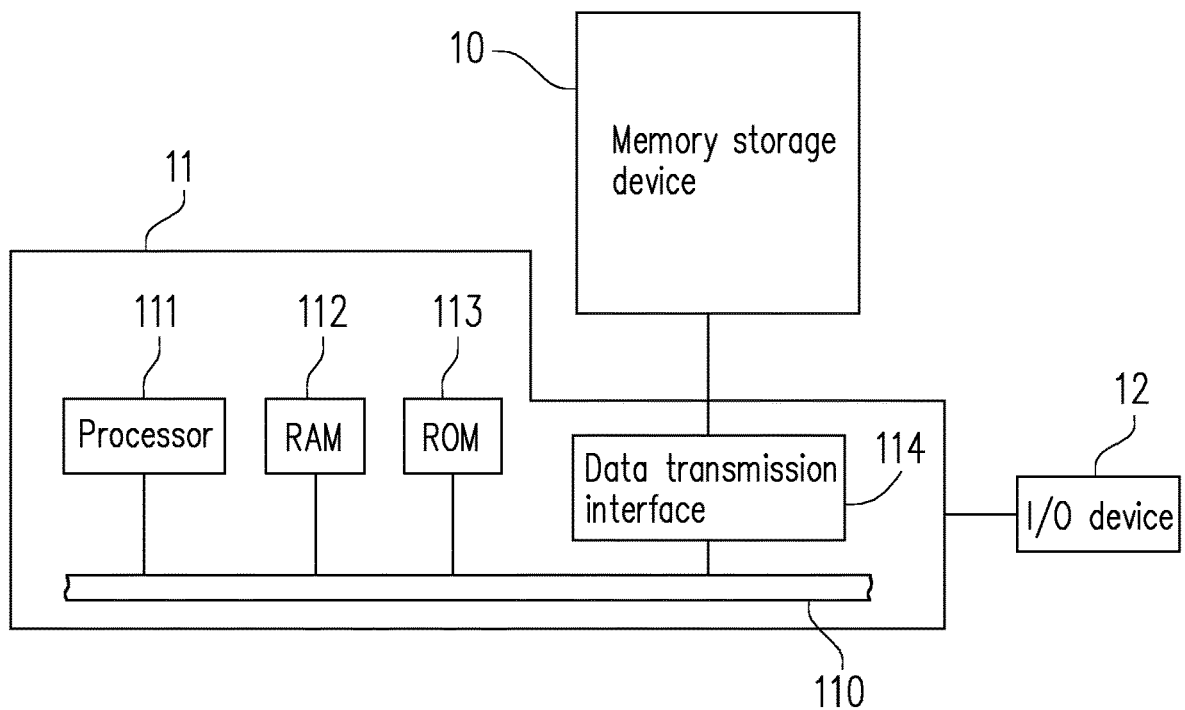
FIG. 1 is a schematic diagram of a host system, a memory storage device and an input/output (I/O) device according to an exemplary embodiment of the invention.
Figure 2:
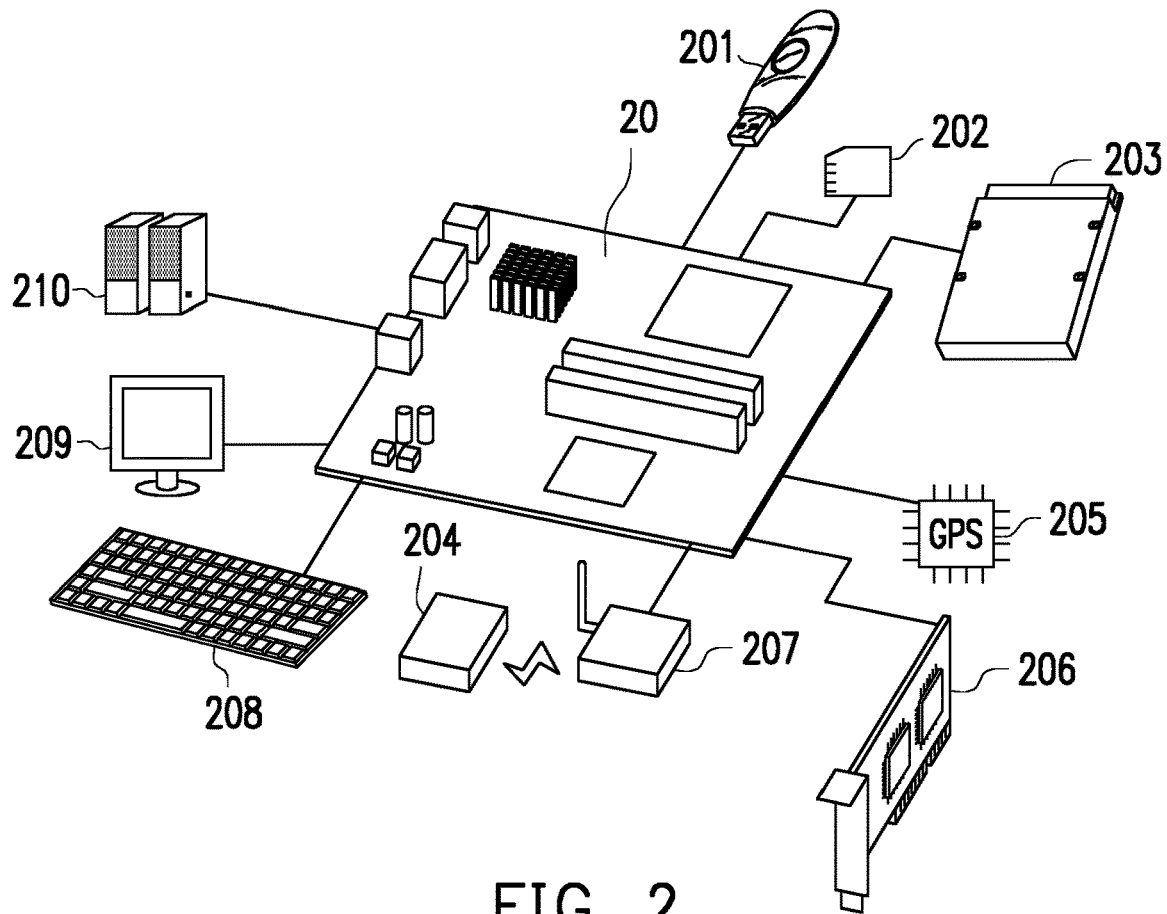
FIG. 2 is a schematic diagram of a host system, a memory storage device and an I/O device according to another exemplary embodiment of the invention.

FIG. 1 is a schematic diagram of a host system, a memory storage device and an input/output (I/O) device according to an exemplary embodiment of the invention. FIG. 2 is a schematic diagram of a host system, a memory storage device and an I/O device according to another exemplary embodiment of the invention.

Referring to FIG. 1 and FIG. 2, the host system 11 generally includes a processor 111, a random access memory (RAM) 112, a read only memory (ROM) 113 and a data transmission interface 114. The processor 111, the RAM 112, the ROM 113 and the data transmission interface 114 are all coupled to a system bus 110.

In the present exemplary embodiment, the host system 11 is coupled to the memory storage device 10 through the data transmission interface 114. For example, the host system 11 may store data into the memory storage device 10 or read data from the memory storage device 10 through the data transmission interface 114. Moreover, the host system 11 is coupled to the I/O device 12 through the system bus 110. For example, the host system 11 may transmit an output signal to the I/O device 12 or receive an input signal from the I/O device 12 through the system bus 110.

In the present exemplary embodiment, the processor 111, the RAM 112, the ROM 113 and the data transmission interface 114 may be disposed on a motherboard 20 of the host system 11. The number of the data transmission interface 114 may be one or plural. The motherboard 20 may be coupled to the memory storage device 10 in a wired or wireless manner. The memory storage device 10 is, for example, a flash drive 201, a memory card 202, a solid state driver (SSD) 203 or a wireless memory storage device 204. The wireless memory storage device 204 is, for example, a memory storage device based on various wireless communication techniques, such as a near field communication (NFC) memory storage device, a wireless fidelity (WiFi) memory storage device, a bluetooth memory storage device or a low power bluetooth memory storage device (for example, iBeacon), etc. Moreover, the motherboard 20 may also be coupled to various I/O devices such as a global positioning system (GPS) module 205, a network interface card 206, a wireless transmission device 207, a keyboard 208, a screen 209, a loudspeaker 210, etc., through the system bus 110. For example, in an exemplary embodiment, the motherboard 20 may access the wireless memory storage device 204 through the wireless transmission device 207.

Figure 3:
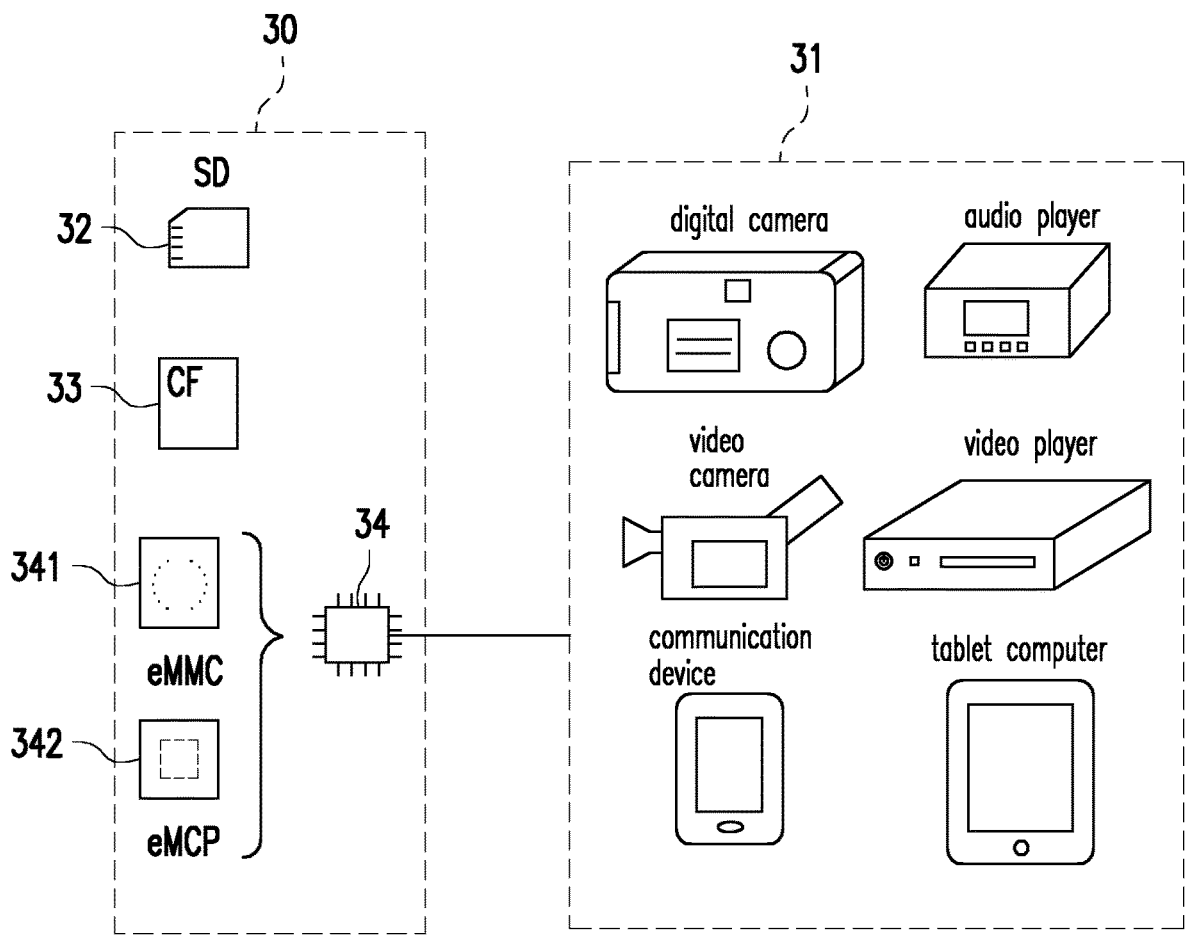
FIG. 3 is a schematic diagram of a host system and a memory storage device according to another exemplary embodiment of the invention.

In an exemplary embodiment, the aforementioned host system may be any system substantially cooperated with the memory storage device to store data. In the aforementioned exemplary embodiment, the host system implemented by a computer system is taken as an example for description; however, FIG. 3 is a schematic diagram of a host system and a memory storage device according to another exemplary embodiment of the invention. Referring to FIG. 3, in another exemplary embodiment, the host system 31 may also be a digital camera, a video camera, a communication device, an audio player, a video player or a tablet PC, etc., and the memory storage device 30 can be a non-volatile memory storage device such as a secure digital (SD) card 32, a compact flash (CF) card 33, or an embedded storage device 34, etc., used by the host system 31. The embedded storage device 34 includes an embedded multimedia card (eMMC) 341 and/or an embedded multi chip package (eMCP) storage device 342, etc., that is formed by directly coupling various memory modules to a substrate of the host system.

Figure 4:
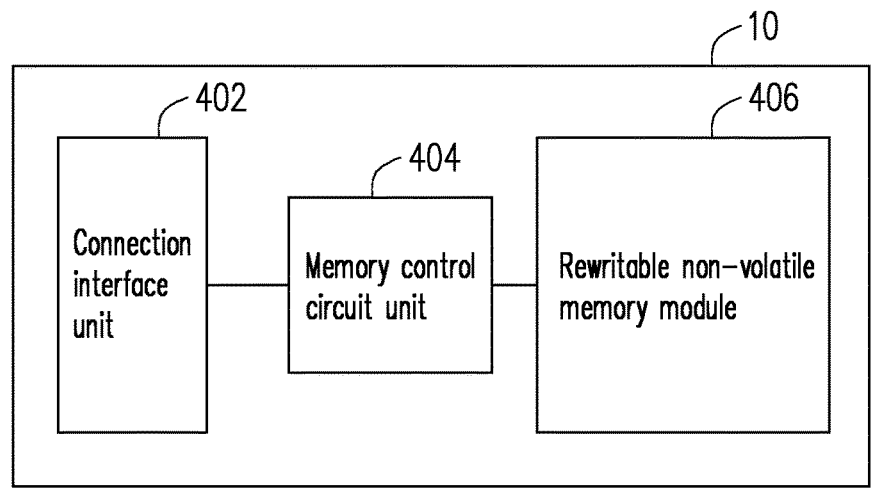
FIG. 4 is a schematic block diagram of a memory storage device according to an exemplary embodiment of the invention.

FIG. 4 is a schematic block diagram of a memory storage device according to an exemplary embodiment of the invention.

Referring to FIG. 4, the memory storage device 10 includes a connection interface unit 402, a memory control circuit unit 404 and a rewritable non-volatile memory module 406.

In the present exemplary embodiment, the connection interface unit 402 is complied with a serial advanced technology attachment (SATA) standard. However, it should be noted that the present invention is not limited thereto, and the connection interface unit 402 may also be complied with a parallel advanced technology attachment (PATA) standard, an institute of electrical and electronic engineers (IEEE) 1394 standard, a peripheral component interconnect (PCI) express standard, a universal serial bus (USB) standard, an SD interface standard, an ultra high speed-I (UHS-I) interface standard, an ultra high speed-II (UHS-II) interface standard, a memory stick (MS) interface standard, a multi-chip package interface standard, a multimedia card (MMC) interface standard, an eMMC interface standard, a universal flash storage (UFS) interface standard, an eMCP interface standard, a CF interface standard, an integrated device electronics (IDE) standard or other suitable standards. The connection interface unit 402 and the memory control circuit unit 404 may be packaged in one chip, or the connection interface unit 402 may be disposed outside a chip containing the memory control circuit unit 404.

The memory control circuit unit 404 may execute a plurality of logic gates or control instructions implemented in a hardware form or a firmware form, and may perform a writing operation, a reading operation or an erasing operation on the rewritable non-volatile memory module 406 according to commands of the host system 11.

The rewritable non-volatile memory module 406 is coupled to the memory control circuit unit 404 for storing data written by the host system 11. The rewritable non-volatile memory module 406 may be a single level cell (SLC) NAND flash memory module (i.e. a flash memory module with one memory cell storing data of one bit), a multi level cell (MLC) NAND flash memory module (i.e. a flash memory module with one memory cell storing data of two bits), a triple level cell (TLC) NAND flash memory module (i.e. a flash memory module with one memory cell storing data of three bits), other flash memory modules or other memory modules having the same characteristic.

The memory cells in the rewritable non-volatile memory module 406 are arranged in an array. The memory cell array arranged in a two-dimensional array is taken as an example for description. However, it should be noted that the following exemplary embodiment is only an example of the memory cell array, and in other exemplary embodiments, configuration of the memory cell array may be adjusted to cope with an actual requirement.

Figure 5:
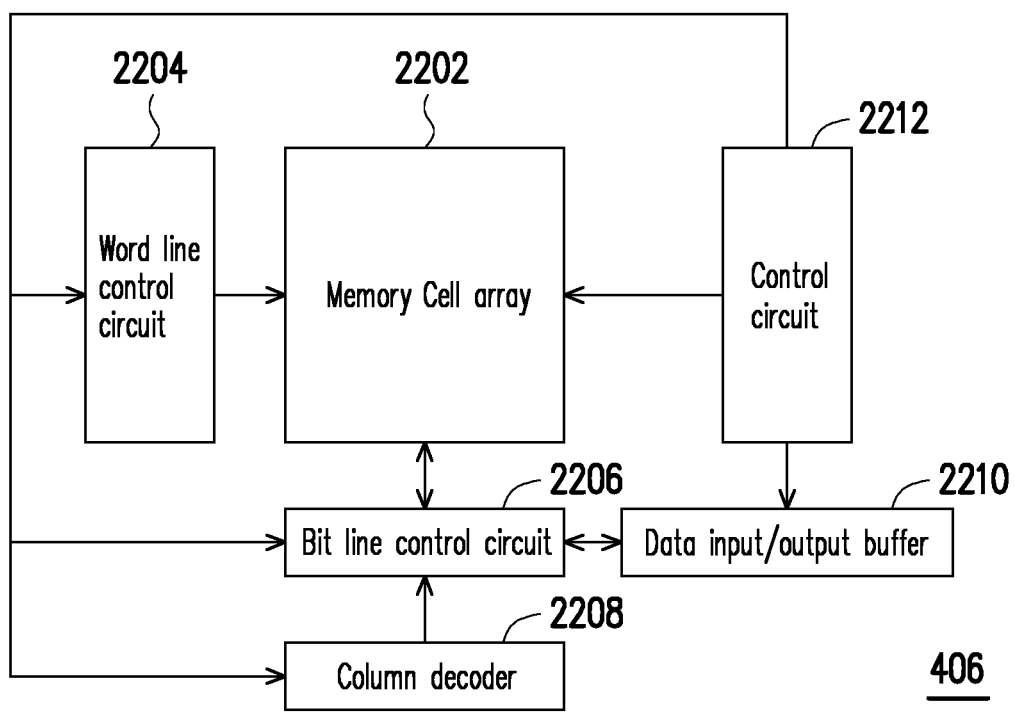
FIG. 5 is a schematic block diagram of a rewritable non-volatile memory module according to an exemplary embodiment of the invention.
Figure 6:
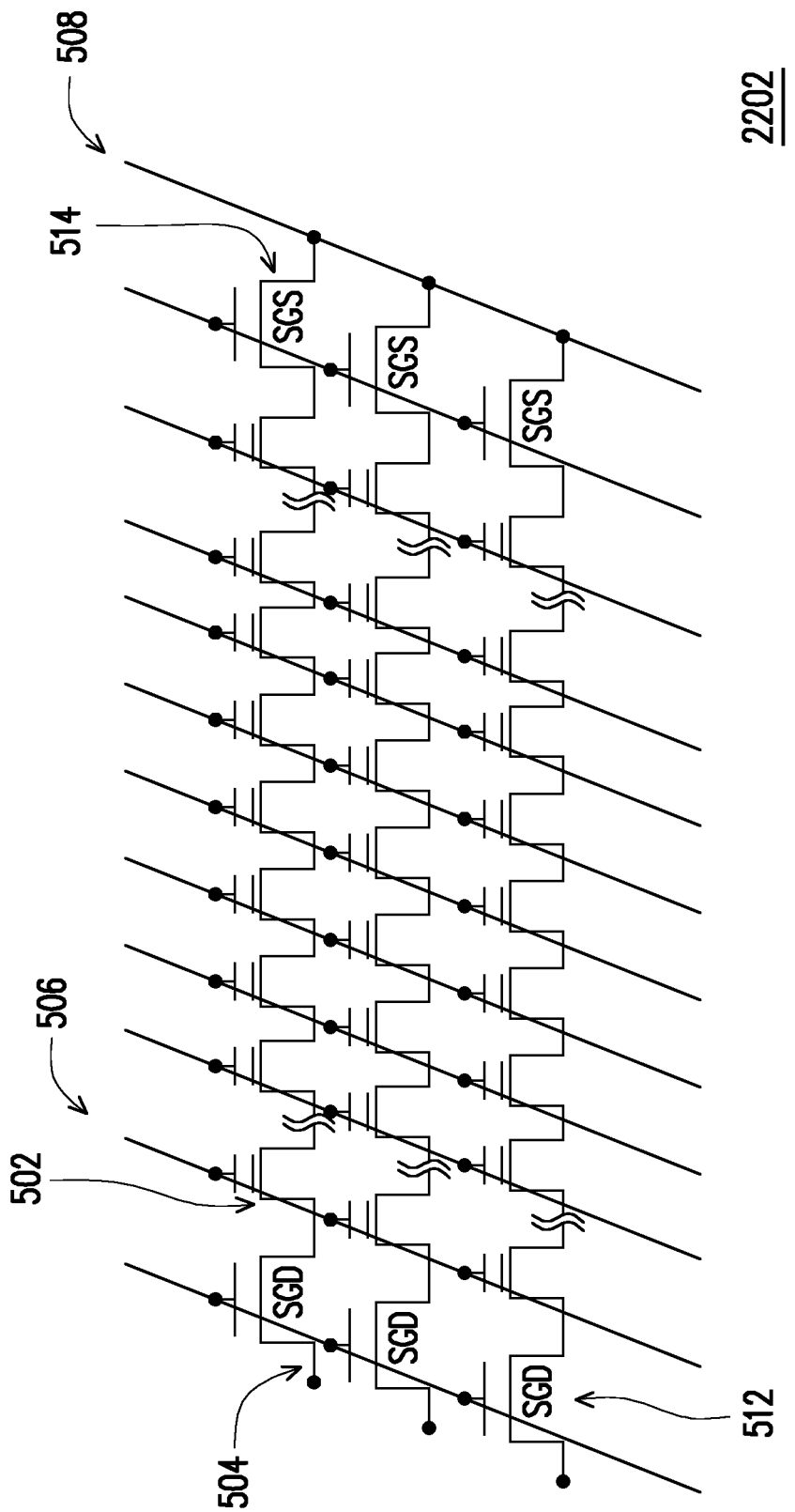
FIG. 6 is a schematic diagram of a memory cell array according to an exemplary embodiment of the invention.

FIG. 5 is a schematic block diagram of a rewritable non-volatile memory module according to an exemplary embodiment of the invention. FIG. 6 is a schematic diagram of a memory cell array according to an exemplary embodiment of the invention.

Referring to FIG. 5 and FIG. 6, the rewritable non-volatile memory module 406 includes a memory cell array 2202, a word line control circuit 2204, a bit line control circuit 2206, a column decoder 2208, a data input/output buffer 2210 and a control circuit 2212.

In the present exemplary embodiment, the memory cell array 2202 may include a plurality of memory cells 502 used for storing data, a plurality of select gate drain (SGD) transistors 512, a plurality of select gate source (SGS) transistors 514, and a plurality of bit lines 504, a plurality of word lines 506 and a common source line 508 connected to the memory cells (as shown in FIG. 6). The memory cells 502 are disposed on intersections of the bit lines 504 and the word lines 506 in an array (or in a 3D stacking manner). When a writing command or a reading command is received from the memory control circuit unit 404, the control circuit 2212 controls the word line control circuit 2204, the bit line control circuit 2206, the column decoder 2208, and the data input/output buffer 2210 to write data into the memory cell array 2202 or read data from the memory cell array 2202, where the word line control circuit 2204 is used for controlling a voltage applied to the word lines 506, the bit line control circuit 2206 is used for controlling a voltage applied to the bit lines 504, the column decoder 2208 selects a corresponding bit line according to a row address in the command, and the data input/output buffer 2210 is used for temporarily storing data.

The memory cells in the rewritable non-volatile memory module 406 store bits through a change of a threshold voltage. To be specific, a control gate and a channel of each of the memory cells have a charge trapping layer therebetween. By applying a writing voltage to the control gate, an amount of electrons of the charge trapping layer may be changed, so as to change the threshold voltage of the memory cell. The procedure of changing the threshold voltage is also referred to as "writing data into the memory cell" or "programming the memory cell". Along with the change of the threshold voltage, each of the memory cells of the memory cell array 2202 has a plurality of storage states, and the storage state of the memory cell may be determined through a reading voltage, so as to obtain the bits stored in the memory cell.

Figure 7:
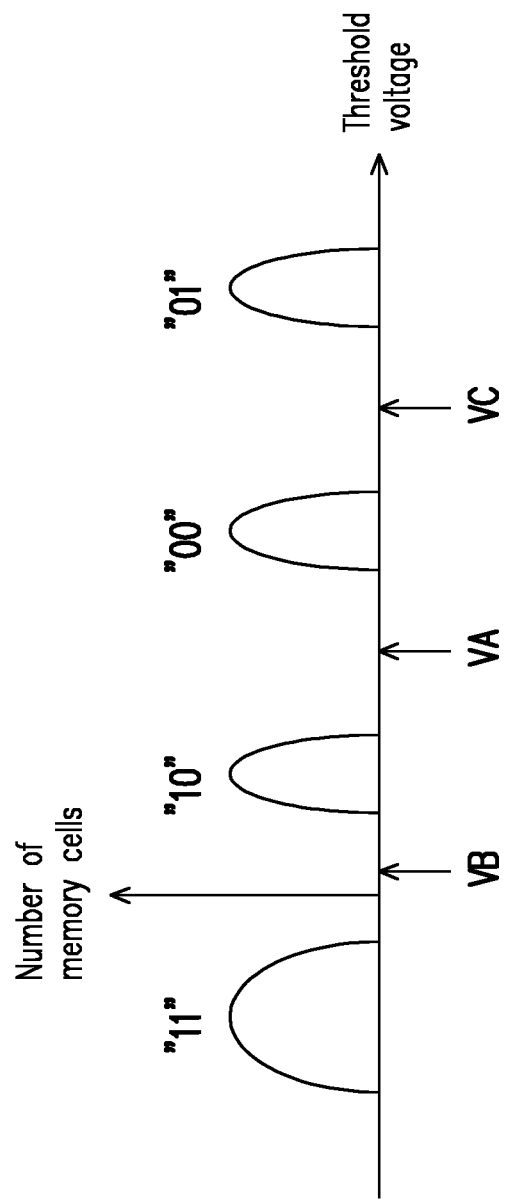
FIG. 7 is a statistical distribution diagram of gate voltages corresponding to writing data stored in the memory cell array according to an exemplary embodiment of the invention.

FIG. 7 is a statistical distribution diagram of gate voltages corresponding to writing data stored in the memory cell array according to an exemplary embodiment of the invention.

Referring to FIG. 7, an MLC NAND flash memory is take as an example for description, along with different threshold voltages, each of the memory cells have four storage states, and the storages states respectively represent bits of "11", "10", "00" and "01". In other words, each of the storage states includes the least significant bit (LSB) and the most significant bit (MSB). In the present exemplary embodiment, in the storage state (i.e. "11", "10", "00" and "01"), a first bit counted from a left side is the LSB, and a second bit counted from the left side is the MSB. Therefore, in the present exemplary embodiment, each of the memory cells may store two bits. It should be noted that the correspondence between the threshold voltages and the storage states shown in FIG. 7 is only an example. In another exemplary embodiment of the invention, the correspondence between the threshold voltages and the storage states is that the storage states have an arrangement of "11", "10", "01" and "00" or other arrangement along with increase of the threshold voltage. Moreover, in another exemplary embodiment of the invention, it is defined that the first bit counted from the left side is the MSB, and the second bit counted from the left side is the LSB.

Figure 8:
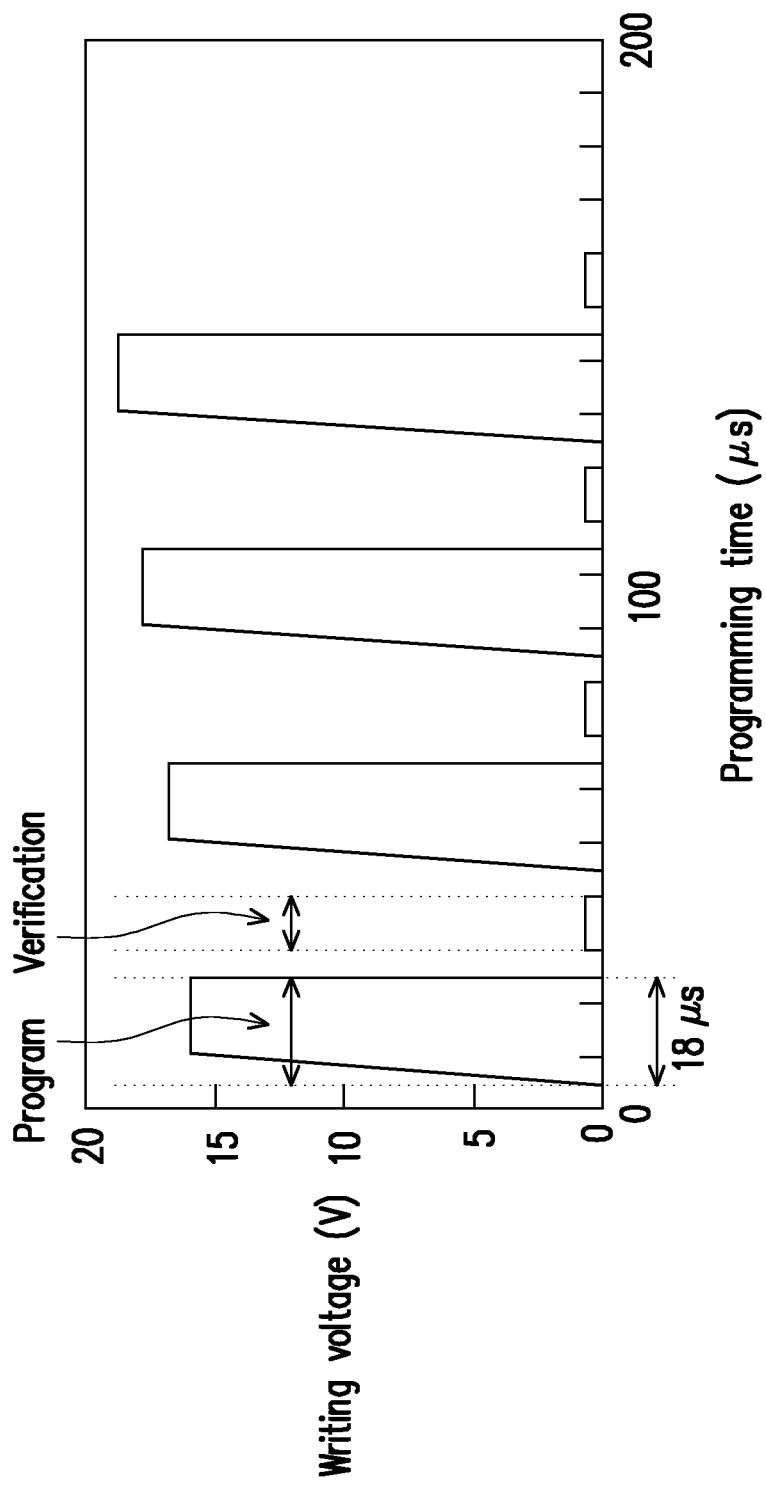
FIG. 8 is a schematic diagram of programming a memory cell according to an exemplary embodiment of the invention.

FIG. 8 is a schematic diagram of programming a memory cell according to an exemplary embodiment of the invention.

Referring to FIG. 8, in the present exemplary embodiment, programming of the memory cells is implemented through a method of pulse writing/verifying threshold voltage. To be specific, when data is to be written into a memory cell, the memory control circuit unit 404 sets an initial writing voltage and a writing pulse time, and instructs the control circuit 2212 of the rewritable non-volatile memory module 406 to program the memory cell by using the initial writing voltage and the writing pulse time, so as to implement the data writing operation. Then, the memory control circuit unit 404 applies a verification voltage to the control gate to determine whether the memory cell is conducted, so as to determine whether the memory cell is in a correct storage state (having a correct threshold voltage). If the memory cell is not programmed to the correct storage state, the memory control circuit unit 404 instructs the control circuit 2212 to add an incremental-step-pulse programming (ISPP) adjusting value to the current applied writing voltage to serve as a new writing voltage, and again programs the memory cell according to the new writing voltage and the writing pulse time. Conversely, if the memory cell has been programmed to the correct storage state, it represents that the data is correctly written into the memory cell. For example, the initial writing voltage is set to 16 volts (V), the writing pulse time is set to 18 microseconds (μs) and the ISPP adjusting value is set to 0.6V, though the invention is not limited thereto.

Figure 9:
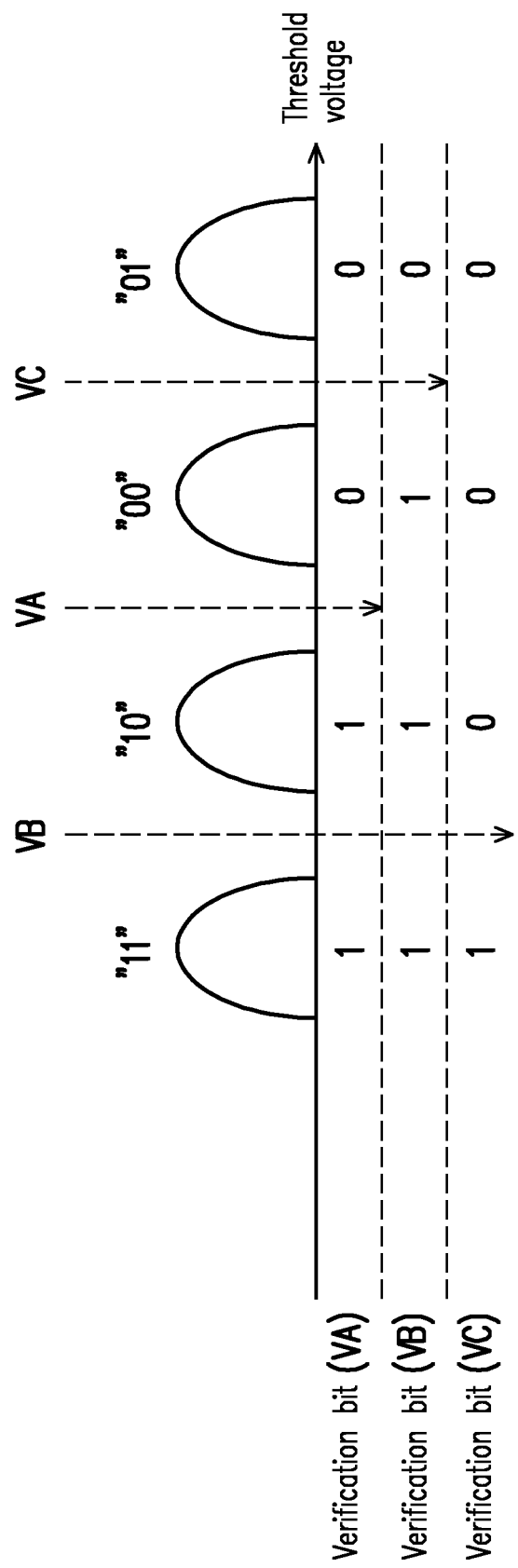
FIG. 9 is a schematic diagram of reading data from a memory cell according to an exemplary embodiment of the invention.

FIG. 9 is a schematic diagram of reading data from the memory cell according to an exemplary embodiment of the invention, where the MLC NAND flash memory is taken as an example for description.

Referring to FIG. 9, a reading operation of the memory cell of the memory cell array 2202 is implemented by applying a reading voltage to the control gate, and identifying the data stored in the memory cell through a conduction state of the memory cell. A verification bit (VA) is used for instructing whether the memory cell is conducted when a reading voltage VA is applied; a verification bit (VC) is used for instructing whether the memory cell is conducted when a reading voltage VC is applied; and a verification bit (VB) is used for instructing whether the memory cell is conducted when a reading voltage VB is applied. It is assumed that the corresponding memory cell is conducted when the verification bit is "1", and the corresponding memory cell is not conducted when the verification bit is "0". As shown in FIG. 9, through the verification bits (VA)-(VC), the storage state of the memory cell is determined, so as to obtain the stored bit.

Figure 10:
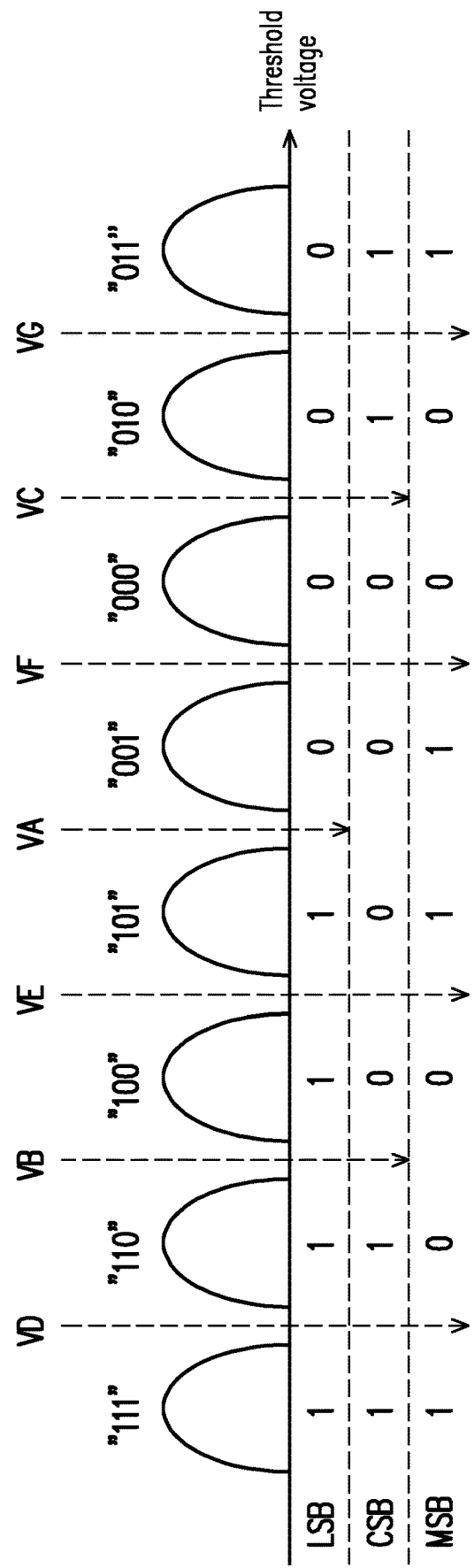
FIG. 10 is a schematic diagram of reading data from a memory cell according to another exemplary embodiment of the invention.

FIG. 10 is a schematic diagram of reading data from the memory cell according to another exemplary embodiment of the invention.

Referring to FIG. 10, a TLC NAND flash memory is taken as an example for description, each of the storages states includes the LSB of the first bit counted from the left side, a center significant bit (CSB) of the second bit counted from the left side and the MSB of a third bit counted from the left side. In the present exemplary embodiment, according to different threshold voltages, the memory cell has 8 storage states (i.e. "111", "110", "100", "101", "001", "000", "010" and "011"). By applying the reading voltages VA-VG to the control gate, the bits stored in the memory cell may be identified.

Figure 11:
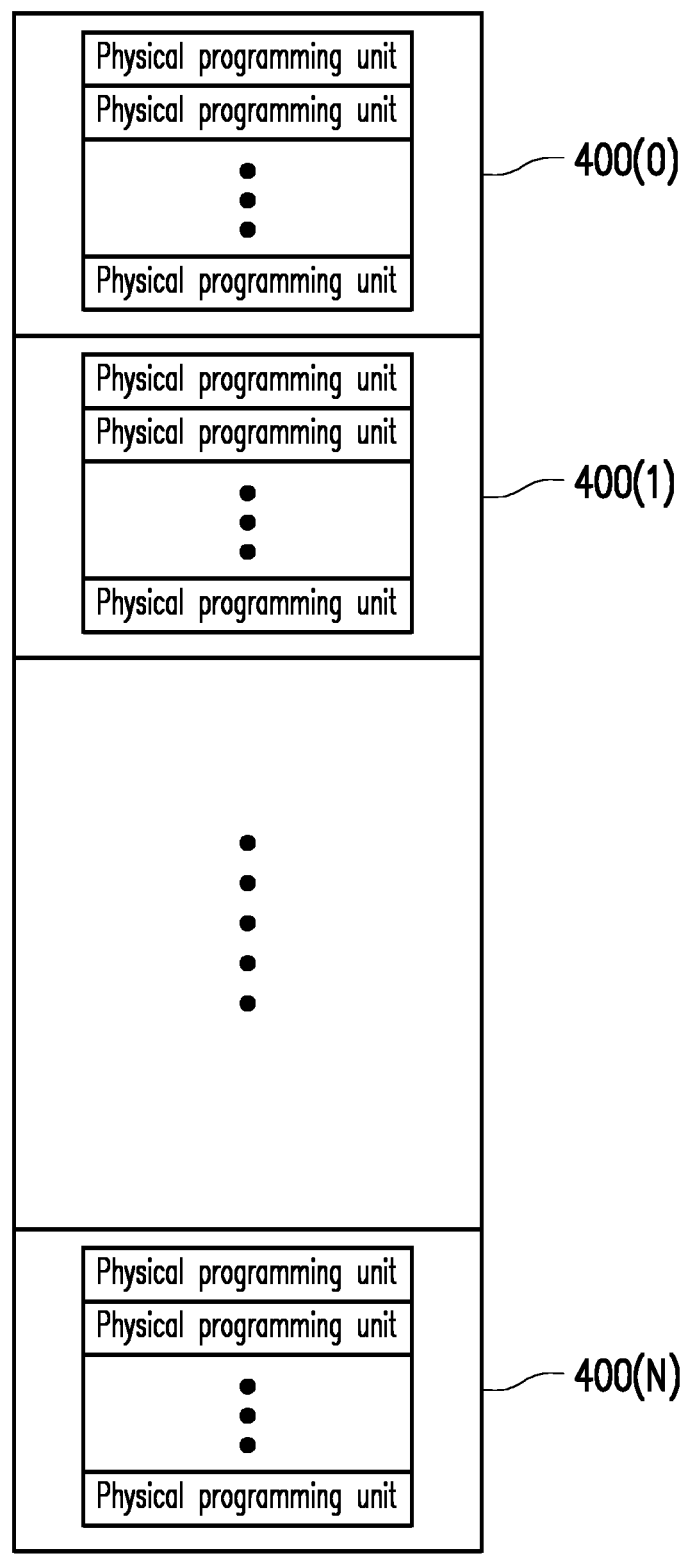
FIG. 11 is a schematic diagram of a rewritable non-volatile memory module according to an exemplary embodiment of the invention.

FIG. 11 is a schematic diagram of a rewritable non-volatile memory module according to an exemplary embodiment of the invention.

Referring to FIG. 11, memory cells 502 of the rewritable non-volatile memory module 406 may construct a plurality of physical programming units, and the physical programming units may construct a plurality of physical erasing units 400(0)-400(N). To be specific, the memory cells on a same word line consist one or a plurality of physical programming units. If one memory cell stores two or more bits, the physical programming units on the same word line may be categorized into a lower physical programming unit and an upper physical programming unit. For example, the LSB of each memory cell belongs to the lower physical programming unit, and the MSB of each memory cell belongs to the upper physical programming unit. In the present exemplary embodiment, physical programming unit is the smallest unit for programming data. Namely, physical programming unit is the smallest unit for writing data. For example, the physical programming unit is a physical page or a physical sector. If the physical programming unit is the physical page, each physical programming unit generally includes a data bit area and a redundant bit area. The data bit area includes a plurality of physical sectors, and is configured to store user data, and the redundant bit area is configured to store system data (for example, error checking and correcting (ECC) codes). In the present exemplary embodiment, each data bit area includes 32 physical sectors, and the size of one physical sector is 512 bytes (B). However, in other exemplary embodiments, the data bit area may also include 8, 16 or more or less physical sectors, and the size and the number of the physical sectors are not limited by the invention. On the other hand, physical erasing unit is the smallest unit for erasing data. Namely, each physical erasing unit contains the least number of memory cells that are erased all together. For example, the physical erasing unit is a physical block.

Figure 12:
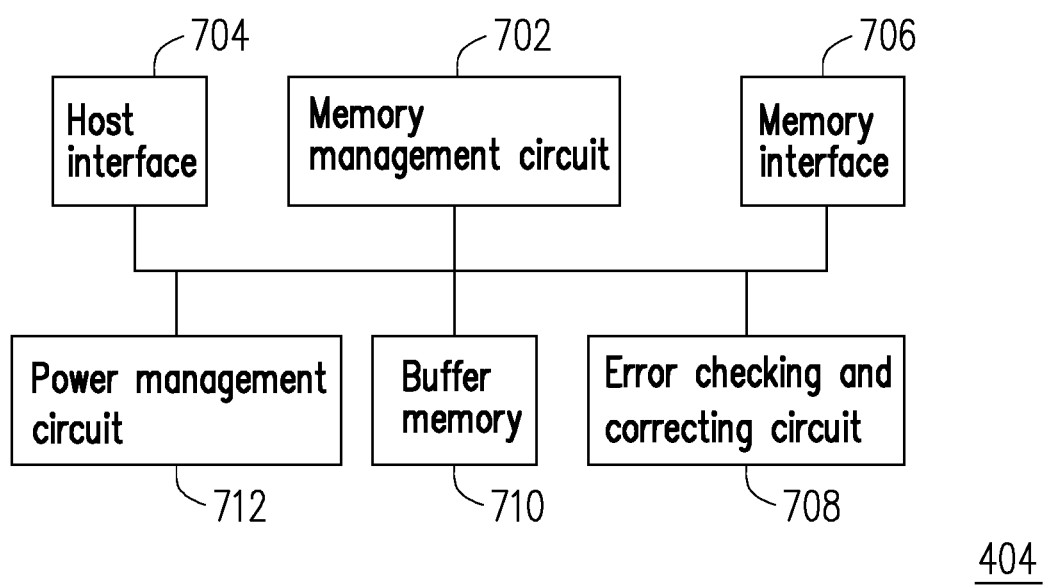
FIG. 12 is a schematic block diagram of a memory control circuit unit according to an exemplary embodiment of the invention.

FIG. 12 is a schematic block diagram of a memory control circuit unit according to an exemplary embodiment of the invention. It should be noted that the structure of the memory control circuit unit in FIG. 12 is only an example, and the invention is not limited thereto.

Referring to FIG. 12, the memory control circuit unit 404 includes a memory management circuit 702, a host interface 704, a memory interface 706 and an error checking and correcting circuit 708.

The memory management circuit 702 is configured to control a whole operation of the memory control circuit unit 404. To be specific, the memory management circuit 702 has a plurality of control instructions, and when the memory storage device 10 operates, these control instructions are executed to implement data writing, reading, erasing operations, etc. Following description of the operations of the memory management circuit 702 or operation of any circuit device included in the memory control circuit unit 404 is equivalent to description of the operations of the memory control circuit unit 404.

In the present exemplary embodiment, the control instructions of the memory management circuit 702 are implemented in a firmware form. For example, the memory management circuit 702 has a micro processing unit (not shown) and a read-only memory (not shown), and these control instructions are burned in the read-only memory. When the memory storage apparatus 10 operates, these control instructions are executed by the micro processing unit to implement the data writing, reading, erasing operations, etc.

In another exemplary embodiment, the control instructions of the memory management circuit 702 may also be stored in a specific area (for example, a system area used for storing system data in the memory module) of the rewritable non-volatile memory module 406 as program codes. Moreover, the memory management circuit 702 has a micro processing unit (not shown), a read-only memory (not shown) and a random access memory (RAM) (not shown). Particularly, the read-only memory has a boot code, and when the memory control circuit unit 404 is enabled, the micro processing unit first runs the boot code to load the control instructions stored in the rewritable non-volatile memory module 406 to the RAM of the memory management circuit 702. Then, the micro processing unit executes these control instructions to implement the data writing, reading, erasing operations, etc.

Moreover, in another exemplary embodiment, the control instructions of the memory management circuit 702 may also be implemented in a hardware form. For example, the memory management circuit 702 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. The memory cell management circuit is used for managing memory cells of the rewritable non-volatile memory module 406 or groups thereof. The memory writing circuit is used for sending a writing command sequence to the rewritable non-volatile memory module 406 to write data into the rewritable non-volatile memory module 406. The memory reading circuit is used for sending a reading command sequence to the rewritable non-volatile memory module 406 to read data from the rewritable non-volatile memory module 406. The memory erasing circuit is used for sending an erasing command sequence to the rewritable non-volatile memory module 406 to erase data in the rewritable non-volatile memory module 406. The data processing circuit is used for processing data to be written into the rewritable non-volatile memory module 406 and data read from the rewritable non-volatile memory module 406. The writing command sequence, the reading command sequence and the erasing command sequence may respectively include one or a plurality of program codes or command codes, and are used for instructing the rewritable non-volatile memory module 406 to execute the corresponding writing, reading, erasing operations, etc. In an exemplary embodiment, the memory management circuit 702 may further send other types of command sequences to the rewritable non-volatile memory module 406 to execute corresponding operations.

The host interface 704 is coupled to the memory management circuit 702, and is configured to receive and recognize commands and data transmitted by the host system 11. Namely, the commands and data transmitted by the host system 11 are transmitted to the memory management circuit 702 through the host interface 704. In the present exemplary embodiment, the host interface 704 is complied with the SATA standard. However, the invention is not limited thereto, and the host interface 704 may also be complied with the PATA standard, the IEEE 1394 standard, the PCI express standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 706 is coupled to the memory management circuit 702 and is configured to access the rewritable non-volatile memory module 406. Namely, data to be written into the rewritable non-volatile memory module 406 is converted into a format that may be accepted by the rewritable non-volatile memory module 406 through the memory interface 706. To be specific, when the memory management circuit 702 accesses the rewritable non-volatile memory module 406, the memory interface 706 sends corresponding command sequences. For example, the command sequences may include a writing command sequence indicating to write data, a reading command sequence indicating to read data, an erasing command sequence indicating to erase data, and corresponding command sequences indicating various memory operations (for example, to change a reading voltage level or execute a garbage collection procedure, etc.). These command sequences are, for example, generated by the memory management circuit 702, and are transmitted to the rewritable non-volatile memory module 406 through the memory interface 706. These command sequences may include one or a plurality of signals, or data on the bus. The signals or data may include command codes or program codes. For example, the reading command sequence may include information of an identification code, a memory address, etc. for reading data.

The error checking and correcting circuit 708 is coupled to the memory management circuit 702 and is used for executing an error checking and correcting procedure to ensure correctness of data. To be specific, when the memory management circuit 702 receives a writing command from the host system 11, the error checking and correcting circuit 708 generates an error correcting code (ECC) and/or an error detecting code (EDC) for the data corresponding to the writing command, and the memory management circuit 702 writes the data corresponding to the writing command and the corresponding ECC and/or the EDC to the rewritable non-volatile memory module 406. Then, when the memory management circuit 702 reads data from the rewritable non-volatile memory module 406, the ECC and/or the EDC corresponding to the data are simultaneously read, and the error checking and correcting circuit 708 performs the error checking and correcting procedure on the read data according to the ECC and/or the EDC.

In an exemplary embodiment of the invention, the memory control circuit unit 404 further includes a buffer memory 710 and a power management circuit 712. The buffer memory 710 is coupled to the memory management circuit 702 and is used for temporarily storing data and commands coming from the host system 11, or data coming from the rewritable non-volatile memory module 406. The power management circuit 712 is coupled to the memory management circuit 702, and is used for controlling a power of the memory storage device 100.

Figure 13:
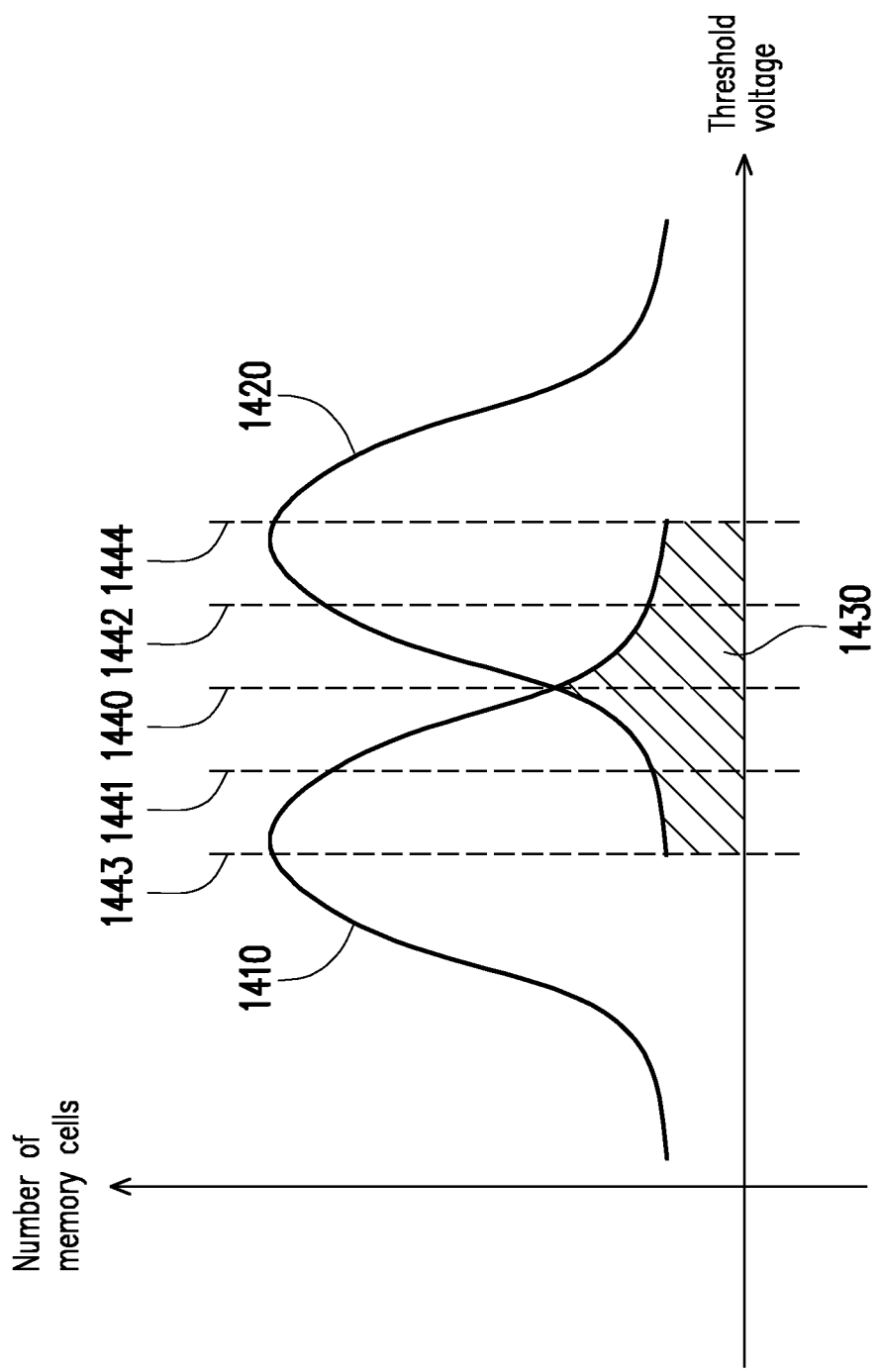
FIG. 13 is a schematic diagram of hard bit mode decoding according to an exemplary embodiment of the invention.

FIG. 13 is a schematic diagram of hard bit mode decoding according to an exemplary embodiment of the invention.

Referring to FIG. 13, an SLC flash memory is taken as an example for description, a distribution 1410 and a distribution 1420 are used for representing storage states of a plurality of first memory cells, and the distribution 1410 and the distribution 1420 respectively represents different storage states. The first memory cells may belong to the same physical programming unit or different physical programming units, which is not limited by the invention. It is assumed that when one memory cell belongs to the distribution 1410, the bit stored in the memory cell is "1", and when the memory cell belongs to the distribution 1420, the bit stored in the memory cell is "0". When the memory management circuit 702 reads the memory cell through a reading voltage 1440, the memory management circuit 702 obtains the verification bit, which is used for instructing whether the memory cell is conducted. It is assumed that the verification bit is "1" when the memory cell is conducted, and is "0" otherwise, though the invention is not limited thereto. If the verification bit is "1", the memory management circuit 702 determines that the memory cell belongs to the distribution 1410, and belongs to the distribution 1420 otherwise. However, the distribution 1410 and the distribution 1420 are overlapped in a region 1430. Namely, some memory cells belonging to the distribution 1410 are recognized as belonging to the distribution 1420, and some memory cells belonging to the distribution 1420 are recognized as belonging to the distribution 1410.

In the present exemplary embodiment, when the first memory cells are to be read, the memory management circuit 702 first selects a reading voltage (for example, a reading voltage 1441) to read the first memory cells to obtain a verification bit of the first memory cells. The error checking and correcting circuit 708 executes a decoding operation (which is also referred to as a first decoding operation) containing a probability decoding algorithm according to the verification bit of the first memory cells to generate a plurality of decoding bits, and the decoding bits may construct a codeword.

In the present exemplary embodiment, the probability decoding algorithm is to take a possible decoding result of a symbol as a candidate, and information input during the decoding process or values of an intermediate operation process are indicated by probabilities of the candidates or a ratio of probabilities between the candidates, so as to determine the most possible candidate. For example, if one symbol has two candidates (bit 0 and bit 1), the probability decoding algorithm is to calculate the most possible candidate according to occurrence probabilities of 0 or 1, or calculate the most possible candidate according to a ratio of probabilities between 0 and 1. It is assumed that there are N candidates, for example, the possible values are 0~N−1 (N is a positive integer, and each candidate represents multiple bits) under a finite field, the probability decoding algorithm is to respectively calculate the probabilities of the N candidate to determine the most possible candidate, or take the probability of one of the values as a denominator to calculate a relative probability ratio to determine the most possible candidate. In an exemplary embodiment, the aforementioned probability ratio may be represented in form of logarithm.

In the present exemplary embodiment, the probability decoding algorithm may also be a convolutional code, a turbo code, a low-density parity-check code or other algorithms with probability decoding features. For example, in the convolutional code and the turbo code, a finite state machine may be applied for encoding and decoding, and in the present exemplary embodiment, the most possible states may be calculated according to the verification bits, so as to generate the decoding bits. The low-density parity-check code is taken as an example for description.

If the low-density parity-check code is applied, when a first decoding operation is executed according to the verification bits, the memory management circuit 702 obtains a decoding initial value of each memory cell according to each of the verification bits. For example, if the verification bit is "1", the memory management circuit 702 sets the decoding initial value of the corresponding memory cell to n; and if the verification bit is "0", the decoding initial value is −n, where n is a positive integer, though the invention does not limit the value of the positive integer n, and in an embodiment, n is, for example, 8.

Then, the error checking and correcting circuit 708 executes iterative decoding of the low-density parity-check algorithm according to the decoding initial values to generate a codeword including a plurality of decoding bits. In the iterative decoding, the decoding initial values are continuously updated to represent a probability, and the probability is also referred to as a reliability or a belief. The updated decoding initial values may be converted into a plurality of decoding bits, and the error checking and correcting circuit 708 may take the decoding bits as a vector, and multiply the vector with a module 2 matrix of a parity-check matrix of the low-density parity-check algorithm, so as to obtain a plurality of syndromes. The syndromes may be used for determining whether the codeword composed of the decoding bits is a valid codeword. If the codeword composed of the decoding bits is the valid codeword, the iterative decoding is stopped, and the error checking and correcting circuit 708 outputs the codeword composed of the decoding bits. If the codeword composed of the decoding bits is an invalid codeword, the decoding initial values are continually updated to generate new decoding bits to perform a next iteration. When the number of iterations reaches a predetermined iteration times, the iterative decoding is stopped. The error checking and correcting circuit 708 determines whether the decoding is successful by using the decoding bits generated by the last iteration. For example, if it is determined that the decoding bits generated by the last iteration constitute the valid codeword according to the syndromes, the decoding is successful; and if the first decoding bits constitute the invalid codeword, it represents that the decoding is failed.

In another exemplary embodiment, the probability decoding algorithm included in the decoding operation is the convolutional code and the turbo code, and the decoding operation further includes other error correcting codes. For example, the convolutional code and the turbo code may be used in collaboration with a parity code of any algorithm. In the decoding operation, after execution of the decoding part of the convolutional code or the turbo code is completed, the parity code may be used for determining whether the codeword composed of the generated decoding bits is the valid codeword, so as to determine whether the decoding is successful.

Regardless of the type of the used error correcting code, if the decoding is failed, it represents that the first memory cells store uncorrectable error bits. If the decoding is failed, the memory management circuit 702 obtains another reading voltage, and uses the another reading voltage (for example, a reading voltage 1442) to read the first memory cells, so as to re-obtain the verification bits of the memory cells. The memory management circuit 702 may execute the aforementioned first decoding operation according to the re-obtained verification bits to obtain another codeword composed of a plurality of decoding bits. In an exemplary embodiment, the error checking and correcting circuit 708 determines whether the another codeword is a valid codeword according to the syndromes corresponding to the another codeword. If the another codeword is not the valid codeword, the memory management circuit 702 determines that the decoding is failed. If the number of times for re-obtaining the reading voltage is not greater than a predetermined number of times, the memory management circuit 702 re-obtains the other reading voltage (for example, a reading voltage 1443), and reads the first memory cells according to the re-obtained reading voltage 1443, so as to re-obtain the verification bits and execute the first decoding operation.

In other words, when there are the uncorrectable error bits, by re-obtaining the reading voltage, the verification bits of some of the memory cells are changed, so as to change some probabilities in the probability decoding algorithm, and it accordingly has a chance to change the decoding result of the decoding operation. Logically, the operation of re-obtaining the reading voltage is required to flip some bits in one codeword, and re-decode the new codeword. In some cases, the codeword that cannot be decoded before the flip (there are the uncorrectable error bits) has a chance of being decoded after the flip. Moreover, in an exemplary embodiment, the memory management circuit 702 may attempt the decoding for several times, until the number of attempts exceeds a predetermined number of times. However, the predetermine number of times is not limited by the invention.

It should be noted that in FIG. 13, the SLC flash memory is taken as an example for description, however, the step of re-obtaining the reading voltage is also adapted to the MLC or TLC flash memory. As shown in FIG. 9, to change the reading voltage VA may flip the LSB of one memory cell, and to change the reading voltage VB or VC may flip the MSB of one memory cell. Therefore, to change the reading voltage VA, VB or VC may all change one codeword into another codeword. The result of changing the codeword is also adapted to the TLC flash memory of FIG. 10. The invention does not limit the use of the SLC, MLC or TLC flash memory.

In the exemplary embodiment of FIG. 13, the decoding initial values of the memory cells are divided into two values (for example, n and −n) according to one verification bit. The iterative decoding executed according to the two values is also referred to as a hard bit mode iterative decoding. However, the step of changing the reading voltage may also be applied to a soft bit mode iterative decoding, where the decoding initial values of each memory cell are determined according to a plurality of verification bits. It should be noted that regardless of the hard bit mode or the soft bit mode, the probabilities of the bits are calculated in the iterative decoding, so that the hard bit mode or the soft bit mode all belong to the probability decoding algorithm.

Figure 14:
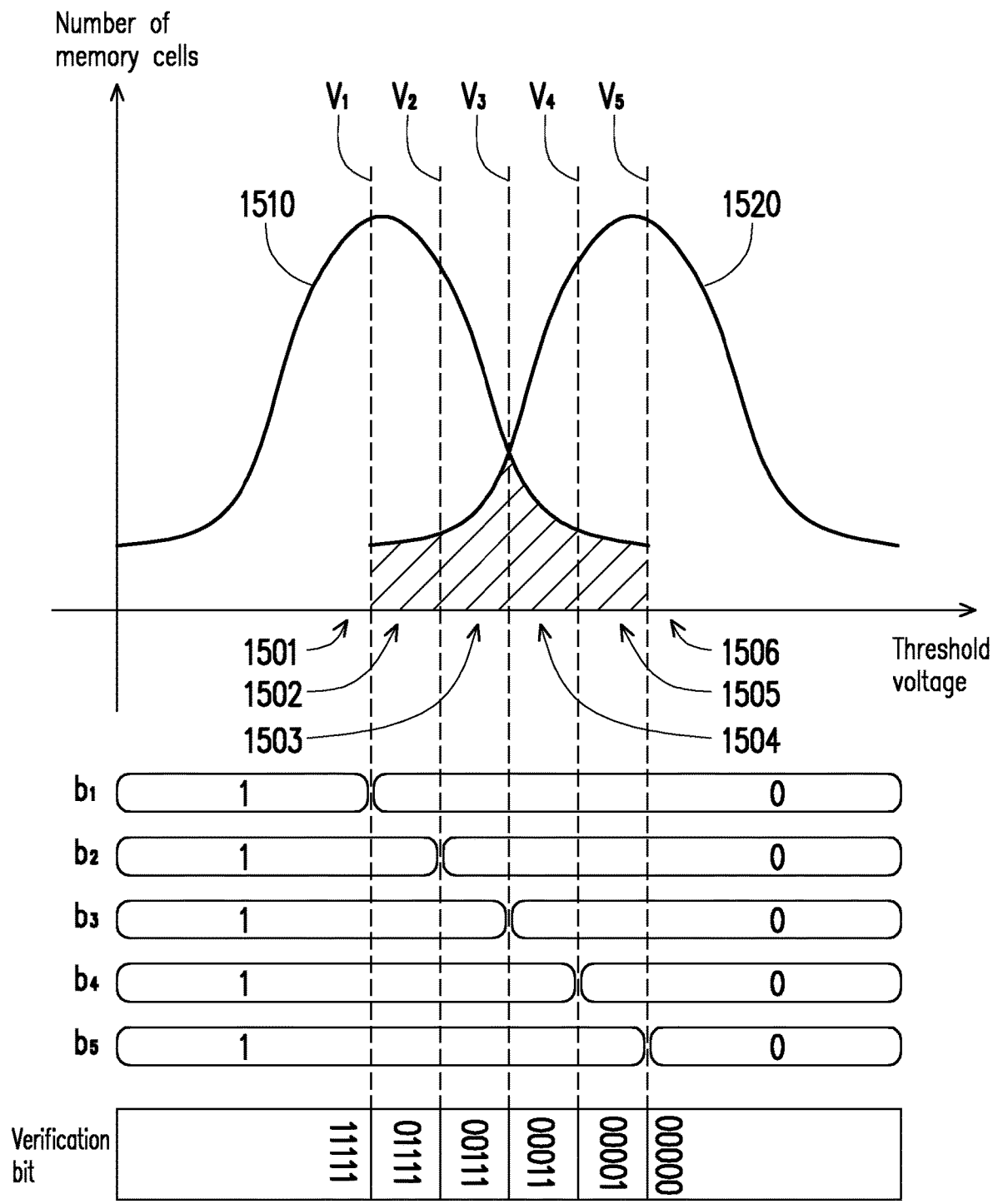
FIG. 14 is a schematic diagram of soft bit mode decoding according to an exemplary embodiment of the invention.

FIG. 14 is a schematic diagram of soft bit mode decoding according to an exemplary embodiment of the invention.

As describe above, after the reading voltage is applied to the control gate of the memory cell, based on whether the memory cell is conducted, the verification bit obtained by the memory management circuit 702 is "0" or "1". It is assumed that the corresponding verification bit is "0" when the memory cell is not conducted, and is "1" otherwise. In FIG. 14, the memory management circuit 702 applies reading voltages $V_1$-$V_5$ to the memory cell to obtain 5 verification bits. To be specific, the reading voltage $V_1$ corresponds to a verification bit $b_1$; the reading voltage $V_2$ corresponds to a verification bit $b_2$; the reading voltage $V_3$ corresponds to a verification bit $b_3$; the reading voltage $V_4$ corresponds to a verification bit $b_4$; and the reading voltage $V_5$ corresponds to a verification bit $b_5$. If the threshold voltage of one memory cell is in a section 1501, from the verification bit $b_1$ to the verification bit $b_5$, the verification bits obtained by the memory management circuit 702 are "11111"; if the threshold voltage of the memory cell is in a section 1502, the verification bits are "01111"; if the threshold voltage of the memory cell is in a section 1503, the verification bits are "00111"; if the threshold voltage of the memory cell is in a section 1504, the verification bits are "00011"; if the threshold voltage of the memory cell is in a section 1505, the verification bits are "00001"; and if the threshold voltage of the memory cell is in a section 1506, the verification bits are "00000".

In the present exemplary embodiment, one of the reading voltages $V_1$-$V_5$ is set as a sign reading voltage. The sign reading voltage is used for determining a sign of the decoding initial value. For example, if the reading voltages $V_3$ is the sign reading voltage, the decoding initial values corresponding to the sections 1501-1503 are smaller than 0, and the decoding initial values corresponding to the sections 1504-1506 are greater than 0. Moreover, in each of the sections, a probability that the memory cell belong to the distribution 1510 and a probability of belonging to the distribution 1520 may be calculated in advance. A log likelihood ratio (LLR) is calculated according to the above two probabilities, and the LLR may be used for determining a magnitude of an absolute value of the decoding initial value. Therefore, the memory management circuit 702 obtains the decoding initial values of the memory cell in the soft bit mode according to the sign reading voltage and the verification bits $b_1$-$b_5$. For example, the decoding initial values corresponding to the sections 1501-1503 may be respectively −8, −4 and −3, and the decoding initial values corresponding to the sections 1504-1506 may be respectively 3, 4 and 8. In an exemplary embodiment, the decoding initial values corresponding to each of the sections may be calculated in advance and stored in a look-up table. The memory management circuit 702 may input the verification bits $b_1$-$b_5$ to the lookup table to obtain the corresponding decoding initial value. In other words, in an actual implementation, the memory management circuit 702 may obtain the decoding initial values of the memory cell in the soft bit mode according to the verification bits $b_1$-$b_5$ without referring to the sign reading voltage. Moreover, if different sign reading voltages are set, the memory management circuit 702 may use different lookup table.

After the memory management circuit 702 obtains the decoding initial values, the error checking and correcting circuit 708 executes the iterative decoding to the decoding initial values to obtain the codeword composed of a plurality of decoding bits, and determine whether the decoding is successful by using the codeword composed of the decoding bits. If the decoding is failed, the memory management circuit 702 re-obtains another reading voltage.

After the other reading voltage is re-obtained, the LLR corresponding to each of the sections is also changed, so that the memory management circuit 702 may use a different lookup table to obtain the decoding initial values. Logically, to change the reading voltage is intended to flip some bits in one codeword, and give different decoding initial values (to change a magnitude or a sign of a value), such that the codeword (having uncorrectable error bits) that cannot be decoded before the change has a chance of being decoded after the change.

In the exemplary embodiment of FIG. 14, one decoding initial value of the soft bit mode decoding is determined by 5 verification bits (reading voltages). However, in other exemplary embodiments, one decoding initial value of the soft bit mode decoding may also be determined by more or less verification bits, which is not limited by the invention.

It should be noted that, generally, the memory management circuit 702 executes the aforementioned soft bit mode decoding operation only after executing the hard bit mode decoding operation and the decoding is failed. However, since the hard bit mode decoding operation and the soft bit mode decoding operation are independent to each other in operation, if the hard bit mode decoding operation and the soft bit mode decoding operation are consecutively executed, since the soft bit mode decoding operation does not refer to related information obtained in execution of the hard bit mode decoding operation, accessing efficiency of the rewritable non-volatile memory module 406 is probably low. However, the method provided by the invention may learn a position of a bit with lower reliability in a codeword in the hard bit mode decoding operation, and obtain related information (for example, a decoding initial value) used for the soft bit mode decoding operation, and then apply the related information to the soft bit mode decoding operation, so as to improve the accessing efficiency of the rewritable non-volatile memory module 406, which is described in detail in the following embodiments.

Figure 15:
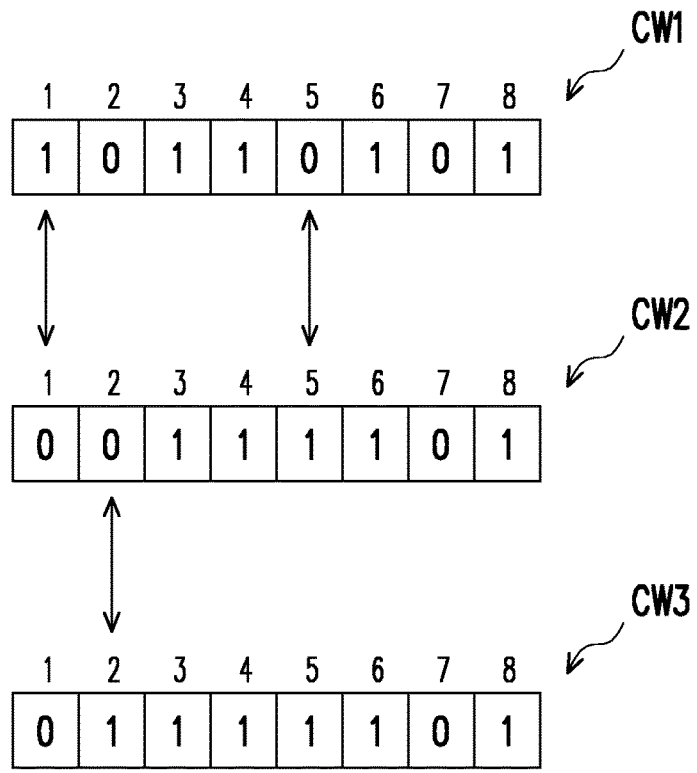
FIG. 15 is a schematic diagram of a bit tagging method according to an exemplary embodiment of the invention.

FIG. 15 is a schematic diagram of a bit tagging method according to an exemplary embodiment of the invention.

Referring to FIG. 15, first, it is assumed that during the process of executing the hard bit mode decoding operation, the memory management circuit 702 uses the reading voltage 1440 (which is also referred to as a first reading voltage) in FIG. 14 to send a reading command sequence (which is also referred to as a first reading command sequence) to read the plurality of first memory cells, and the error checking and correcting circuit 708 executes the hard bit mode decoding operation (which is also referred to as a first decoding operation). It is assumed that the number of times of iterations for executing the hard bit mode decoding operation reaches the last time and the obtained codeword is a codeword CW1 (which is also referred to as a first codeword). A value of the codeword CW1 is "10110101". It should be noted that in the present exemplary embodiment, the codeword CW1 is composed of 8 decoding bits (i.e. the codeword CW1 includes X bits, and X is 8). However, the codeword CW1 may also be composed of more or less decoding bits.

Then, during the process of executing the hard bit mode decoding operation, the error checking and correcting circuit 708 executes a parity-check procedure to the codeword CW1 to generate a plurality of syndromes (which are also referred to as first verification information). For example, the codeword CW1 is multiplied with a parity-check matrix to obtain a plurality of syndromes. The error checking and correcting circuit 708 determines whether the first codeword is a valid codeword according to the first verification information. If the error checking and correcting circuit 708 determines that the first codeword is not the valid codeword, it is determined that the codeword CW1 decoding is failed.

Figure 16:
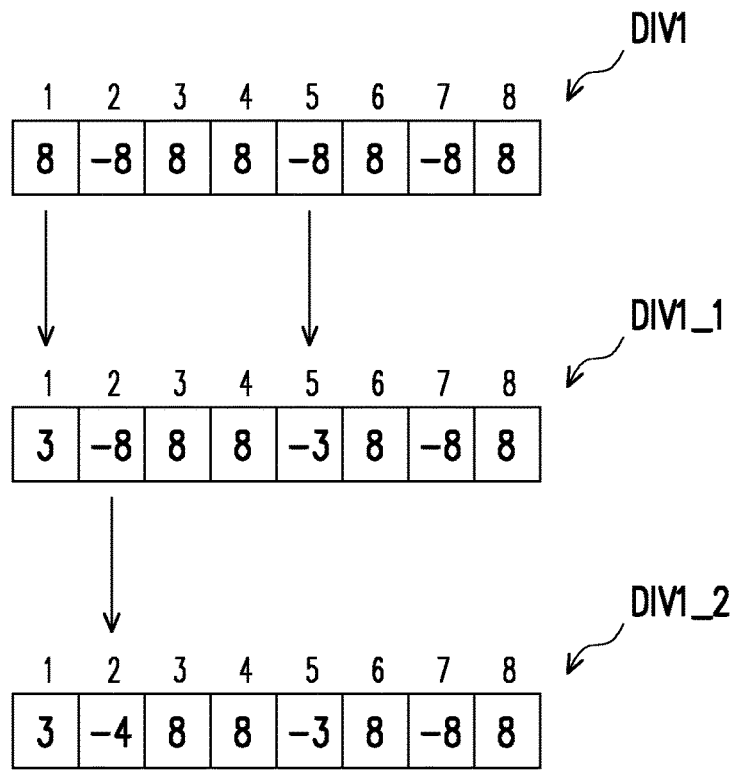
FIG. 16 is a schematic diagram of decoding initial values corresponding to a codeword according to an exemplary embodiment of the invention.

Particularly, in the present exemplary embodiment, the memory management circuit 702 further records the decoding initial values corresponding to each of the decoding bits in the codeword CW1. For example, FIG. 16 is a schematic diagram of decoding initial values corresponding to a codeword according to an exemplary embodiment of the invention. Referring to FIG. 15 and FIG. 16, it is assumed that the codeword CW1 corresponds to the decoding initial value DIV1 (which is also referred to as a first decoding initial value) of FIG. 16, if a bit value in the codeword CW1 is "0", a value corresponding to the bit value in the decoding initial value DIV1 is "−8"; if a bit value in the codeword CW1 is "1", a value corresponding to the bit value in the decoding initial value DIV1 is "8". Therefore, the values of the decoding initial value DIV1 corresponding to the codeword CW1 are "8 −8 8 8 −8 8 −8 8".

Referring to FIG. 15 again, it is assumed that during the process of executing the hard bit mode decoding operation, the memory management circuit 702, for example, uses another reading voltage 1442 (which is also referred to as a second reading voltage) in FIG. 14 to send another reading command sequence (which is also referred to as a second reading command sequence) to retry-read the aforementioned plurality of first memory cells. It is assumed that during such process of retry-reading and executing the hard bit mode decoding operation, the number of times of iterations reaches the last time and the obtained codeword is a codeword CW2 (which is also referred to as a second codeword). A value of the codeword CW2 is "00111101". It should be noted that the codeword CW2 is also composed of 8 decoding bits (i.e. the codeword CW2 includes X bits, and X is 8).

Then, the error checking and correcting circuit 708 executes a parity-check procedure to the codeword CW2 to generate a plurality of syndromes (which are also referred to as second verification information). For example, the codeword CW2 is multiplied with the parity-check matrix to obtain a plurality of syndromes. The error checking and correcting circuit 708 determines whether the second codeword CW2 is a valid codeword according to the second verification information. If the error checking and correcting circuit 708 determines that the codeword CW2 is not the valid codeword, it is determined that the codeword CW2 decoding is failed.

Particularly, the memory management circuit 702 may perform (or execute) an XOR operation to the codeword CW1 and the codeword CW2 to find different bits in the codeword CW1 and the codeword CW2. As shown in FIG. 15, after performing the XOR operation to the codeword CW1 and the codeword CW2, it is learned that a $1^{st}$ and a $5^{th}$ bits in the codeword CW1 is different to a $1^{st}$ and a $5^{th}$ bits in the codeword CW2. Now, the memory management circuit 702 may record the $1^{st}$ and the $5^{th}$ bits in the codeword composed of the 8 decoding bits as unreliable bits (which are also referred to as first unreliable bits), where the first unreliable bit is a $Y^{th}$ bit in the X bits, and Y is a positive integer less than or equal to X.

After the first unreliable bits are found, the decoding initial value DIV1 may be modified. In detail, in the decoding initial value DIV1 of FIG. 16, if a value in the decoding initial value DIV1 is "8", it represents that the decoding bit corresponding to such value has a higher probability to be "1". If a value in the decoding initial value DIV1 is "−8", it represents that the decoding bit corresponding to such value has a higher probability to be "0".

However, based on the aforementioned XOR operation, it is known that the $1^{st}$ and the $5^{th}$ bits in the codeword CW1 are different to the $1^{st}$ and the $5^{th}$ bits in the codeword CW2, so that the memory management circuit 702 may record the $1^{st}$ and the $5^{th}$ bits in the 8 bits constructing the codeword as unreliable bits. Now, the memory management circuit 702 accordingly adjusts the corresponding values (which are also referred to as first corresponding values) in the decoding initial value DIV1 according to the found unreliable bits (i.e. the $1^{st}$ and the $5^{th}$ bits). The memory management circuit 702 may modify a $1^{st}$ and a $5^{th}$ values in the decoding initial value DIV1 to generate the adjusted decoding initial value. As shown in FIG. 16, the memory management circuit 702 may adjust a $1^{st}$ value in the decoding initial value DIV1 from "8" to "3" for representing that the decoding bit corresponding to the $1^{st}$ value has a lower probability to be "1"; moreover, the memory management circuit 702 may adjust a $5^{th}$ value in the decoding initial value DIV1 from "−8" to "−3" for representing that the decoding bit corresponding to the $5^{th}$ value has a lower probability to be "0". Therefore, the decoding initial value DIV1 is adjusted to generate the adjusted decoding initial value DIV1_1, and values of the decoding initial value DIV1_1 are "3 −8 8 8 −3 8 −8 8".

Referring to FIG. 15 again, it is assumed that during the process of executing the hard bit mode decoding operation, the memory management circuit 702, for example, uses another reading voltage 1441 (which is also referred to as a third reading voltage) in FIG. 14 to send another reading command sequence (which is also referred to as a third reading command sequence) to retry-read the aforementioned plurality of first memory cells. It is assumed that during such process of retry-reading and executing the hard bit mode decoding operation, the number of times of iterations reaches the last time and the obtained codeword is a codeword CW3 (which is also referred to as a third codeword). A value of the codeword CW3 is "01111101". It should be noted that the codeword CW3 is also composed of 8 decoding bits (i.e. the codeword CW3 includes X bits, and X is 8).

Then, the error checking and correcting circuit 708 executes a parity-check procedure to the codeword CW3 to generate a plurality of syndromes (which are also referred to as third verification information). For example, the codeword CW3 is multiplied with the parity-check matrix to obtain a plurality of syndromes. The error checking and correcting circuit 708 determines whether the codeword CW3 is a valid codeword according to the third verification information. If the error checking and correcting circuit 708 determines that the codeword CW3 is not the valid codeword, it is determined that the codeword CW3 decoding is failed.

Particularly, the memory management circuit 702 may perform an XOR operation to the codeword CW2 and the codeword CW3 to find different bits in the codeword CW2 and the codeword CW3. As shown in FIG. 15, after performing the XOR operation to the codeword CW2 and the codeword CW3, it is learned that a $2^{nd}$ bit in the codeword CW2 is different to a $2^{nd}$ bit in the codeword CW3. Now, the memory management circuit 702 may record the $2^{nd}$ bit in the codeword composed of the 8 decoding bits as an unreliable bit (which is also referred to as a second unreliable bit), where the second unreliable bit is a $Z^{th}$ bit in the X bits, and Z is a positive integer less than or equal to X.

After the second unreliable bit is found, the decoding initial value DIV1_1 may be modified. In detail, through the aforementioned XOR operation, it is learned that the $2^{nd}$ bit in the codeword CW2 is different to the $2^{nd}$ bit in the code word CW3, so that the memory management circuit 702 records the $2^{nd}$ bit in 8 bits constructing the codeword as the unreliable bit (which is also referred to as the second unreliable bit).

Now, the memory management circuit 702 accordingly adjusts the corresponding value (which is also referred to as a second corresponding value) in the decoding initial value DIV1_1 according to the found second unreliable bit (i.e. the $2^{nd}$ bit), where the corresponding value is the $2^{nd}$ value in the decoding initial value DIV1_1, which is modified to generate a decoding initial value DIV1_2. As shown in FIG. 16, the memory management circuit 702 may adjust the $2^{nd}$ value in the decoding initial value DIV1_2 from "−8" to "−4" for representing that the decoding bit corresponding to the $2^{nd}$ value has a lower probability to be "0". Therefore, the decoding initial value DIV1_1 is adjusted to generate the decoding initial value DIV1_2, and values of the decoding initial value DIV1_2 are "3 −4 8 8 −3 8 −8 8".

It should be noted that in a plurality of syndromes produced by one codeword, if a more number of the value 1 exists in the syndromes, it represents that the codeword has more error bits; conversely, if a less number of the value 1 exists in the syndromes, it represents that the codeword has less error bits. Therefore, the syndromes generated by each codeword may be respectively summed up to determine the number of the error bits in one codeword. In the present exemplary embodiment, it is assumed that a sum of the syndromes (i.e. the first verification information) corresponding to the codeword CW1 is less than a sum of the syndromes (i.e. the second verification information) corresponding to the codeword CW2, and the sum of the syndromes (i.e. the second verification information) corresponding to the codeword CW2 is less than a sum of the syndromes (i.e. the third verification information) corresponding to the codeword CW3.

Since the number of the error bits in the codeword CW1 is less than the number of the error bits in the codeword CW2, and the number of the error bits in the codeword CW2 is less than the number of the error bits in the codeword CW3. It may be deduced that the first unreliable bits (i.e. the $1^{st}$ and the $5^{th}$ bits in 8 bits) in the codeword CW1 and the codeword CW2 should be the bits with the lowest reliability (or the highest error rate), so that the $1^{st}$ value in the decoding initial value DIV1 may be adjusted from "8" to "3", which represents that the $1^{st}$ bit value in the codeword CW1 has a lower probability to be "1"; similarly, the $5^{th}$ value in the decoding initial value DIV1 may be adjusted from "−8" to "−3", which represents that the $5^{th}$ bit value in the codeword CW1 has a lower probability to be "0".

Moreover, since the sum of the syndromes corresponding to the codeword CW3 is the maximum, it is known that the aforementioned different bits (i.e. the $2^{nd}$ bit in 8 bits) in the codeword CW2 and the codeword CW3 should be the bits with the second lowest reliability (or the second highest error rate), so that the $2^{nd}$ value in the decoding initial value DIV1_1 may be adjusted from "−8" to "−4", which represents that the $2^{nd}$ bit value in the codeword CW1 has a lower probability to be "0". Namely, the smaller an absolute value of a value in the values of the decoding initial value is, the lower probability a specific decoding bit corresponding to the value has. For example, if a value in the values of the decoding initial value is "−3", the probability that a decoding bit corresponding to such value is decoded to "0" is smaller than the probability that a decoding bit corresponding to "−4" in the values of the decoding initial value is decoded to "0".

In other words, the reliability of the first unreliable bit is smaller than the reliability of the second unreliable bit.

Then, the memory management circuit 702 may take the decoding initial value DIV1_2 as the decoding initial value of the soft bit mode decoding operation (which is also referred to as the second decoding operation) to perform decoding, so as to improve execution efficiency of the soft bit mode decoding operation. The execution method of the soft bit mode decoding operation has been described in detail above, and details thereof are not repeated.

It should be noted that in the exemplary embodiments of FIG. 15 and FIG. 16, the hard bit mode decoding operation is only executed by three times, though the invention is not limited thereto. In other embodiments, the more times of the hard bit mode decoding operation may be executed. For example, the hard bit mode decoding operation may be executed for the fourth time to generate a codeword CW4 (not shown), and the XOR operation may be again performed to the codeword CW3 and the codeword CW4 to find the error bits and again update the decoding initial value DIV1_2, and the soft bit mode decoding operation is executed according to the updated decoding initial value.

Particularly, in the present exemplary embodiment, the rewritable non-volatile memory module 406 does not record a corresponding relationship between a plurality of reading voltages and the storage states of a plurality of memory cells of the rewritable non-volatile memory module 406. In other words, if the memory management circuit 702 sequentially uses a plurality of reading voltages to read the memory cells, the sums of a plurality of syndromes generated after using the reading voltages to read the memory cells are not arranged in sequence. Therefore, the memory management circuit 702 may arrange the sums of the obtained syndromes from small to large to generate an arranging sequence, and perform the XOR operation to the codeword corresponding to the smallest sum of the syndromes and the codeword corresponding to the second smallest sum of the syndromes to find the different bit with the lowest reliability and update the corresponding decoding initial value, and perform the XOR operation to the codeword corresponding to the second smallest sum of the syndromes and the codeword corresponding to the third smallest sum of the syndromes to find the different bit with the second lowest reliability and update the corresponding decoding initial value, and so on. In this way, the invention may also be applied to the situation that the corresponding relationship between the reading voltages and the storage states of the memory cells is unknown.

It should be noted that the exemplary embodiments of FIG. 15 and FIG. 16 are applied to a retry-reading mechanism. To be specific, the memory management circuit 702 is configured with a preset reading voltage group and a plurality of retry-reading voltage groups used for retry-reading in advance. When the first memory cells are read for the first time, the memory management circuit 702 selects the aforementioned first reading voltage from the above preset reading voltage group to execute the hard bit mode decoding operation. When a first voltage in the preset reading voltage group is applied to read the first memory cells through decoding failure is occurred, the memory management circuit 702 may execute the retry-reading mechanism. In detail, the memory management circuit 702 may select the aforementioned second reading voltage from one of the retry-reading voltage groups to execute the retry-reading of the first time and execute the hard bit mode decoding operation. During the retry-reading of the first time, if the decoding failure is occurred, the memory management circuit 702 may execute the retry-reading of the second time. In detail, the memory management circuit 702 may select the aforementioned third reading voltage from the above retry-reading voltage group to read the first memory cells and execute the hard bit mode decoding operation. It should be noted that although the retry-reading operation is only performed by two times, the number of times of performing the retry-reading operation is not limited by the invention.

Figure 17:
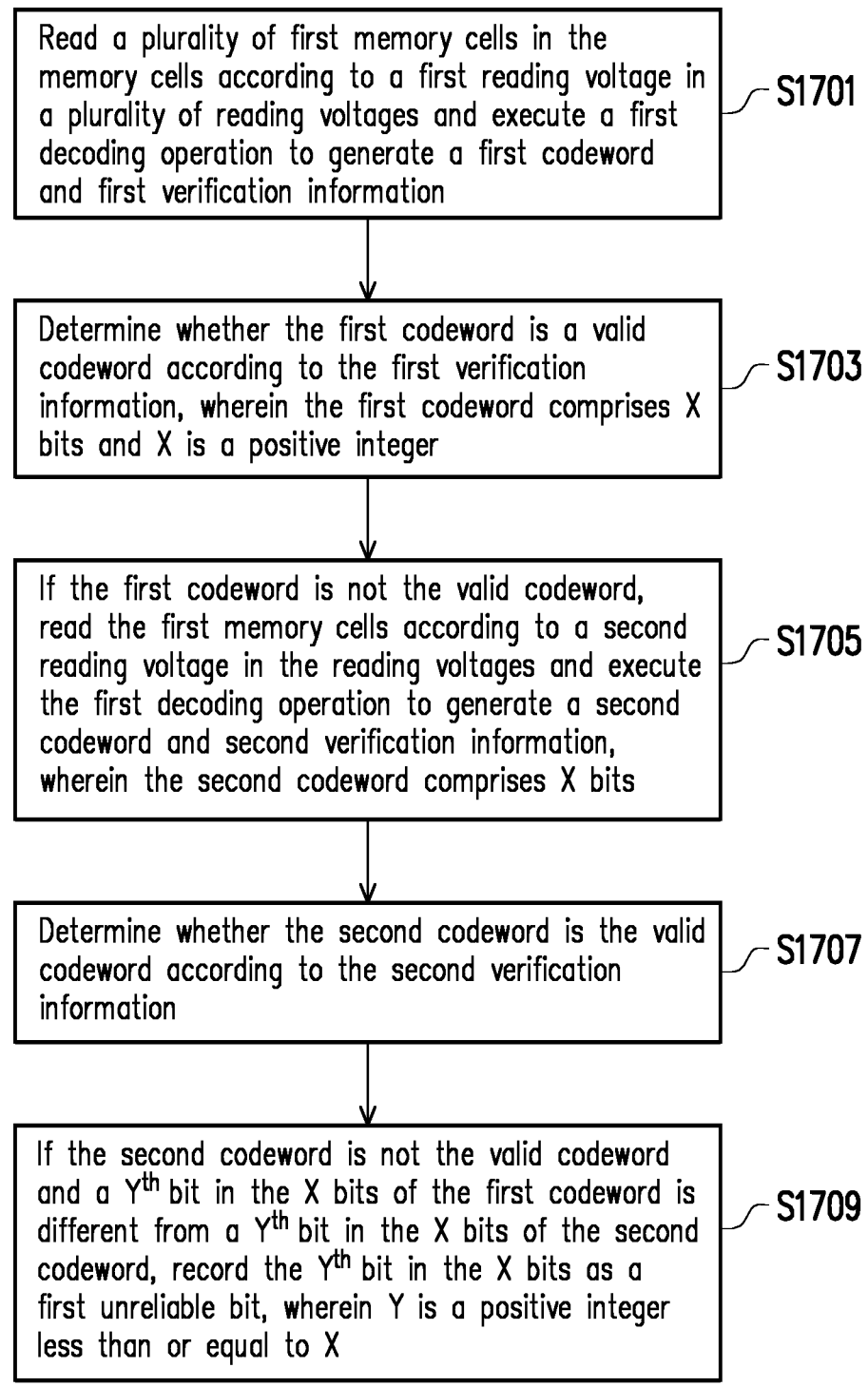
FIG. 17 is a flowchart illustrating a bit tagging method according to an exemplary embodiment of the invention.

FIG. 17 is a flowchart illustrating a bit tagging method according to an exemplary embodiment of the invention.

Referring to FIG. 17, in step S1701, the memory management circuit 702 reads a plurality of first memory cells in the memory cells according to a first reading voltage in a plurality of reading voltages and executes a first decoding operation to generate a first codeword and first verification information. In step S1703, the memory management circuit 702 determines whether the first codeword is a valid codeword according to the first verification information, where the first codeword includes X bits and X is a positive integer. If the first codeword is not the valid codeword, in step S1705, the memory management circuit 702 reads the first memory cells according to a second reading voltage in the reading voltages and executes the first decoding operation to generate a second codeword and second verification information, where the second codeword includes X bits. In step S1707, the memory management circuit 702 determines whether the second codeword is the valid codeword according to the second verification information. If the second codeword is not the valid codeword and a $Y^{th}$ bit in the X bits of the first codeword is different from a $Y^{th}$ bit in the X bits of the second codeword, in step S1709, the memory management circuit 702 records the $Y^{th}$ bit in the X bits as a first unreliable bit, where Y is a positive integer less than or equal to X.

In summary, the bit tagging method, the memory control circuit unit and the memory storage device of the invention may learn a bit with lower reliability in a codeword in a hard bit mode decoding operation, and obtain related information (for example, a decoding initial value) for a soft bit mode decoding operation, and then apply the related information to the soft bit mode decoding operation, so as to improve accessing efficiency of the rewritable non-volatile memory module.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A bit tagging method, adapted to a rewritable non-volatile memory module, wherein the rewritable non-volatile memory module comprises a plurality of memory cells, the bit tagging method comprising:

reading a plurality of first memory cells in the memory cells according to a first reading voltage of a plurality of reading voltages and executing a first decoding operation to generate a first codeword and first verification information, and determining whether the first codeword is a valid codeword according to the first verification information, wherein the first codeword comprises X bits and X is a positive integer;

when the first codeword is not the valid codeword, reading the first memory cells according to a second reading voltage of the plurality of reading voltages and executing the first decoding operation to generate a second codeword and second verification information, and determining whether the second codeword is the valid codeword according to the second verification information, wherein the second codeword comprises X bits; and when the second codeword is not the valid codeword and a $Y^{th}$ bit in the X bits of the first codeword is different from a $Y^{th}$ bit in the X bits of the second codeword, recording the $Y^{th}$ bit in the X bits as a first unreliable bit, wherein Y is a positive integer less than or equal to X.

2. The bit tagging method as claimed in claim 1, wherein the rewritable non-volatile memory module does not record a corresponding relationship between the plurality of reading voltages and storage states of the memory cells.

3. The bit tagging method as claimed in claim 1, further comprising:
   reading the first memory cells according to a third reading voltage of the plurality of reading voltages and executing the first decoding operation to generate a third codeword and third verification information, and determining whether the third codeword is the valid codeword according to the third verification information, wherein the third codeword comprises X bits; and
   when the third codeword is not the valid codeword and a $Z^{th}$ bit in the X bits of the second codeword is different from a $Z^{th}$ bit in the X bits of the third codeword, recording the $Z^{1h}$ bit in the X bits as a second unreliable bit,
   wherein Z is a positive integer less than or equal to X, a sum of the first verification information is less than a sum of the second verification information and the sum of the second verification information is less than a sum of the third verification information.

4. The bit tagging method as claimed in claim 3, wherein reliability of the first unreliable bit is less than reliability of the second unreliable bit.

5. The bit tagging method as claimed in claim 4, further comprising:
   adjusting a first corresponding value of a first decoding initial value corresponding to the first codeword according to the first unreliable bit, wherein the first decoding initial value comprises X values, and the first corresponding value is a $Y^{th}$ value in the X values of the first decoding initial value;
   adjusting a second corresponding value of the first decoding initial value according to the second unreliable bit, wherein the second corresponding value is a $Z^{th}$ value in the X values of the first decoding initial value; and
   executing a second decoding operation according to the adjusted first decoding initial value to generate a fourth codeword.

6. The bit tagging method as claimed in claim 5, wherein the first decoding operation is a hard bit mode decoding operation and the second decoding operation is a soft bit mode decoding operation.

7. The bit tagging method as claimed in claim 1, further comprising:
   performing an XOR operation to the first codeword and the second codeword to determine whether the $Y^{th}$ bit in the X bits of the first codeword is the same to the $Y^{th}$ bit in the X bits of the second codeword.

8. A memory control circuit unit, adapted to a rewritable non-volatile memory module, wherein the rewritable non-volatile memory module comprises a plurality of memory cells, and the memory control circuit unit comprises:
   a host interface, coupled to a host system;
   an error checking and correcting circuit;
   a memory interface, coupled to the rewritable non-volatile memory module; and
   a memory management circuit, coupled to the host interface, the error checking and correcting circuit and the memory interface,
   wherein the memory management circuit sends a first reading command sequence according to a first reading voltage of a plurality of reading voltages to read a plurality of first memory cells in the memory cells, and executes a first decoding operation through the error checking and correcting circuit to generate a first codeword and first verification information, and determines whether the first codeword is a valid codeword according to the first verification information, wherein the first codeword comprises X bits and X is a positive integer,
   when the first codeword is not the valid codeword, the memory management circuit sends a second reading command sequence according to a second reading voltage of the plurality of reading voltages to read the first memory cells, and executes the first decoding operation through the error checking and correcting circuit to generate a second codeword and second verification information, and determines whether the second codeword is the valid codeword according to the second verification information, wherein the second codeword comprises X bits,
   when the second codeword is not the valid codeword and a $Y^{th}$ bit in the X bits of the first codeword is different from a $Y^{th}$ bit in the X bits of the second codeword, the memory management circuit further records the $Y^{th}$ bit in the X bits as a first unreliable bit, wherein Y is a positive integer less than or equal to X.

9. The memory control circuit unit as claimed in claim 8, wherein the rewritable non-volatile memory module does not record a corresponding relationship between the plurality of reading voltages and storage states of the memory cells.

10. The memory control circuit unit as claimed in claim 8, wherein
   the memory management circuit sends a third reading command sequence according to a third reading voltage of the plurality of reading voltages to read the first memory cells, and executes the first decoding operation through the error checking and correcting circuit to generate a third codeword and third verification information, and determines whether the third codeword is the valid codeword according to the third verification information, wherein the third codeword comprises X bits, and
   when the third codeword is not the valid codeword and a $Z^{th}$ bit in the X bits of the second codeword is different from a $Z^{th}$ bit in the X bits of the third codeword, the memory management circuit records the $Z^{th}$ bit in the X bits as a second unreliable bit,
   wherein Z is a positive integer less than or equal to X, a sum of the first verification information is less than a sum of the second verification information and the sum of the second verification information is less than a sum of the third verification information.

11. The memory control circuit unit as claimed in claim 10, wherein reliability of the first unreliable bit is less than reliability of the second unreliable bit.

12. The memory control circuit unit as claimed in claim 11, wherein
   the memory management circuit adjusts a first corresponding value of a first decoding initial value corresponding to the first codeword according to the first unreliable bit, wherein the first decoding initial value comprises X values, and the first corresponding value is a $Y^{th}$ value in the X values of the first decoding initial value, the memory management circuit adjusts a second corresponding value of the first decoding initial value according to the second unreliable bit, wherein the second corresponding value is a $Z^{th}$ value in the X values of the first decoding initial value, and the memory management circuit executes a second decoding operation according to the adjusted first decoding initial value to generate a fourth codeword.

13. The memory control circuit unit as claimed in claim 12, wherein the first decoding operation is a hard bit mode decoding operation and the second decoding operation is a soft bit mode decoding operation.

14. The memory control circuit unit as claimed in claim 8, wherein the memory management circuit performs an XOR operation to the first codeword and the second codeword to determine whether the $Y^{th}$ bit in the X bits of the first codeword is the same to the $Y^{th}$ bit in the X bits of the second codeword.

15. A memory storage device, comprising:

a connection interface unit, coupled to a host system;

a rewritable non-volatile memory module, having a plurality of memory cells; and a memory control circuit unit, coupled to the connection interface unit and the rewritable non-volatile memory module, wherein the memory control circuit unit sends a first reading command sequence according to a first reading voltage of a plurality of reading voltages to read a plurality of first memory cells in the memory cells, and executes a first decoding operation to generate a first codeword and first verification information, and determines whether the first codeword is a valid codeword according to the first verification information, wherein the first codeword comprises X bits and X is a positive integer, when the first codeword is not the valid codeword, the memory control circuit unit sends a second reading command sequence according to a second reading voltage of the plurality of reading voltages to read the first memory cells, and executes the first decoding operation to generate a second codeword and second verification information, and determines whether the second codeword is the valid codeword according to the second verification information, wherein the second codeword comprises X bits, when the second codeword is not the valid codeword and a $Y^{th}$ bit in the X bits of the first codeword is different from a $Y^{th}$ bit in the X bits of the second codeword, the memory control circuit unit records the $Y^{th}$ bit in the X bits as a first unreliable bit, wherein Y is a positive integer less than or equal to X.

16. The memory storage device as claimed in claim 15, wherein the rewritable non-volatile memory module does not record a corresponding relationship between the plurality of reading voltages and storage states of the memory cells.

17. The memory storage device as claimed in claim 15, wherein the memory control circuit unit sends a third reading command sequence according to a third reading voltage of the plurality of reading voltages to read the first memory cells, and executes the first decoding operation to generate a third codeword and third verification information, and determines whether the third codeword is the valid codeword according to the third verification information, wherein the third codeword comprises X bits, and when the third codeword is not the valid codeword and a $Z^{th}$ bit in the X bits of the second codeword is different from a $Z^{th}$ bit in the X bits of the third codeword, the memory control circuit unit records the $Z^{th}$ bit in the X bits as a second unreliable bit, wherein Z is a positive integer less than or equal to X, a sum of the first verification information is less than a sum of the second verification information and the sum of the second verification information is less than a sum of the third verification information.

18. The memory storage device as claimed in claim 17, wherein reliability of the first unreliable bit is less than reliability of the second unreliable bit.

19. The memory storage device as claimed in claim 18, wherein the memory control circuit unit adjusts a first corresponding value of a first decoding initial value corresponding to the first codeword according to the first unreliable bit, wherein the first decoding initial value comprises X values, and the first corresponding value is a $Y^{th}$ value in the X values of the first decoding initial value, the memory control circuit unit adjusts a second corresponding value of the first decoding initial value according to the second unreliable bit, wherein the second corresponding value is a $Z^{th}$ value in the X values of the first decoding initial value, and the memory control circuit unit executes a second decoding operation according to the adjusted first decoding initial value to generate a fourth codeword.

20. The memory storage device as claimed in claim 19, wherein the first decoding operation is a hard bit mode decoding operation and the second decoding operation is a soft bit mode decoding operation.

21. The memory storage device as claimed in claim 15, wherein the memory control circuit unit performs an XOR operation to the first codeword and the second codeword to determine whether the $Y^{th}$ bit in the X bits of the first codeword is the same to the $Y^{th}$ bit in the X bits of the second codeword.

* * * * *